US010739170B2

(12) United States Patent
    Marsh

(10) Patent No.: US 10,739,170 B2
(45) Date of Patent: Aug. 11, 2020

(54) MICRO FLOW MEASUREMENT DEVICES AND DEVICES WITH MOVABLE FEATURES

(71) Applicant: Encite LLC, Burlington, MA (US)

(72) Inventor: Stephen Alan Marsh, Carlisle, MA (US)

(73) Assignee: Encite LLC, Burlington, MA (US)

( * ) Notice: Subject to any disclaimer, the term of this patent is extended or adjusted under 35 U.S.C. 154(b) by 120 days.

(21) Appl. No.: 16/053,074

(22) Filed: Aug. 2, 2018

(65) Prior Publication Data

US 2019/0041247 A1     Feb. 7, 2019

Related U.S. Application Data

(60) Provisional application No. 62/585,641, filed on Nov. 14, 2017, provisional application No. 62/541,128, filed on Aug. 4, 2017.

(51) Int. Cl.
    *G01F 1/06*      (2006.01)
    *G01F 15/00*     (2006.01)
    *H05K 3/38*      (2006.01)
    *G01F 15/06*     (2006.01)

(52) U.S. Cl.
    CPC .............. *G01F 1/06* (2013.01); *G01F 15/00* (2013.01); *H05K 3/386* (2013.01); *G01F 15/006* (2013.01); *G01F 15/068* (2013.01)

(58) Field of Classification Search
    CPC .............. G01F 1/06; G01F 15/00; H05K 3/38
    See application file for complete search history.

(56) References Cited

U.S. PATENT DOCUMENTS

| | | | |
|---|---|---|---|
| 5,687,767 A | 11/1997 | Bowers | |
| 5,836,750 A | 11/1998 | Cabuz | |
| 6,106,245 A | 8/2000 | Cabuz | |
| 6,179,586 B1 | 1/2001 | Herb | |
| 6,247,908 B1 * | 6/2001 | Shinohara | F04B 43/046 417/413.2 |
| 6,261,066 B1 | 7/2001 | Linnemann | |
| 6,443,154 B1 * | 9/2002 | Jalde | A61M 16/20 128/201.28 |
| 6,568,286 B1 | 5/2003 | Cabuz | |

(Continued)

OTHER PUBLICATIONS http://www.murata-ps.com/emena/2012-05-22.html 2 pages.
JP Official Action in JP Appln. No. 2016-572361 dated Jan. 4, 2019, 11 pages.

*Primary Examiner* — Jewel V Dowtin
(74) *Attorney, Agent, or Firm* — Fish & Richardson P.C.

(57) ABSTRACT

Disclosed is a micro flow device including a body frame defining a chamber and having a first port and a second port into the chamber. A first membrane carrying a first electrode is disposed over a first face of the body frame and a second membrane carrying a second electrode is disposed over a second face of the body frame. An axle member is disposed in the chamber affixed to the first and second membrane and a wheel member is disposed in the chamber about the axle member and spaced from the axle element by a gap. An interrupter feature is formed on the wheel, with the interrupter feature causing a variation in capacitance between the first and second electrodes during rotation of the wheel. Also disclosed are techniques for providing freely rotating, sliding, moving, etc. features in devices fabricated by roll to roll processes.

16 Claims, 27 Drawing Sheets

(56) References Cited

U.S. PATENT DOCUMENTS

| | | | | |
|---|---|---|---|---|
| 6,758,107 | B2* | 7/2004 | Cabuz | F04B 43/043 |
| | | | | 417/320 |
| 6,889,567 | B2 | 10/2005 | Cabuz | |
| 7,090,471 | B2 | 8/2006 | Xie et al. | |
| 7,802,970 | B2* | 9/2010 | Singhal | F04B 43/043 |
| | | | | 417/410.2 |
| 8,365,771 | B2* | 2/2013 | Xue | A62B 18/025 |
| | | | | 128/206.12 |
| 9,038,407 | B2* | 5/2015 | Pearson | H01L 23/473 |
| | | | | 62/259.2 |
| 9,257,366 | B2* | 2/2016 | Bernstein | F16K 99/0042 |
| 10,143,864 | B2* | 12/2018 | Mittelstadt | F16K 15/148 |
| 2002/0029814 | A1 | 3/2002 | Unger | |
| 2003/0106799 | A1 | 6/2003 | Covington et al. | |
| 2003/0231967 | A1 | 12/2003 | Najafi et al. | |
| 2004/0103899 | A1 | 6/2004 | Noble | |
| 2004/0115068 | A1 | 6/2004 | Hansen et al. | |
| 2009/0074595 | A1 | 3/2009 | Chen et al. | |
| 2009/0129952 | A1 | 5/2009 | Patrascu et al. | |
| 2009/0130607 | A1 | 5/2009 | Slafer | |
| 2010/0181871 | A1 | 7/2010 | Daniel et al. | |
| 2011/0207328 | A1 | 8/2011 | Speakman | |
| 2013/0046330 | A1 | 4/2013 | Kabasawa et al. | |
| 2014/0147346 | A1 | 5/2014 | Chitnis et al. | |

* cited by examiner

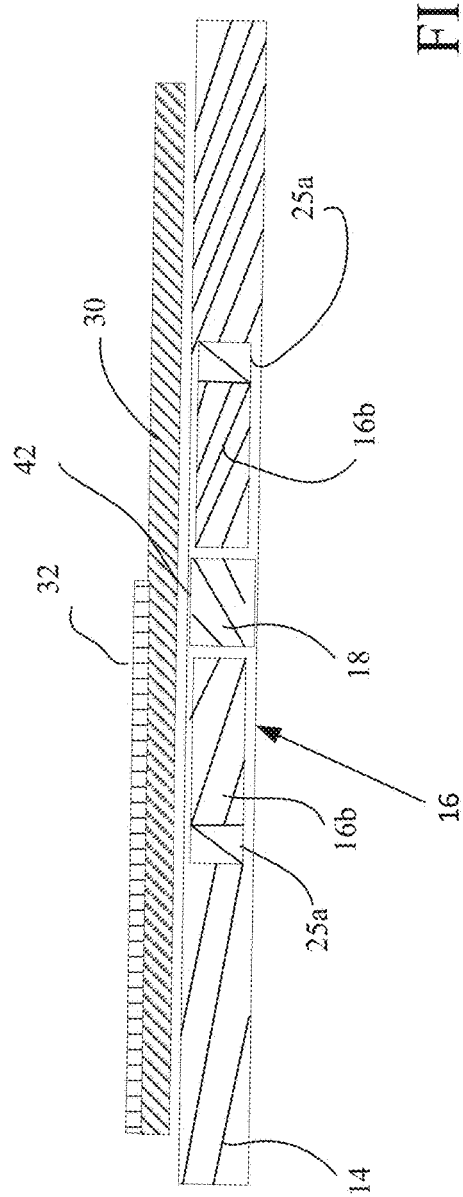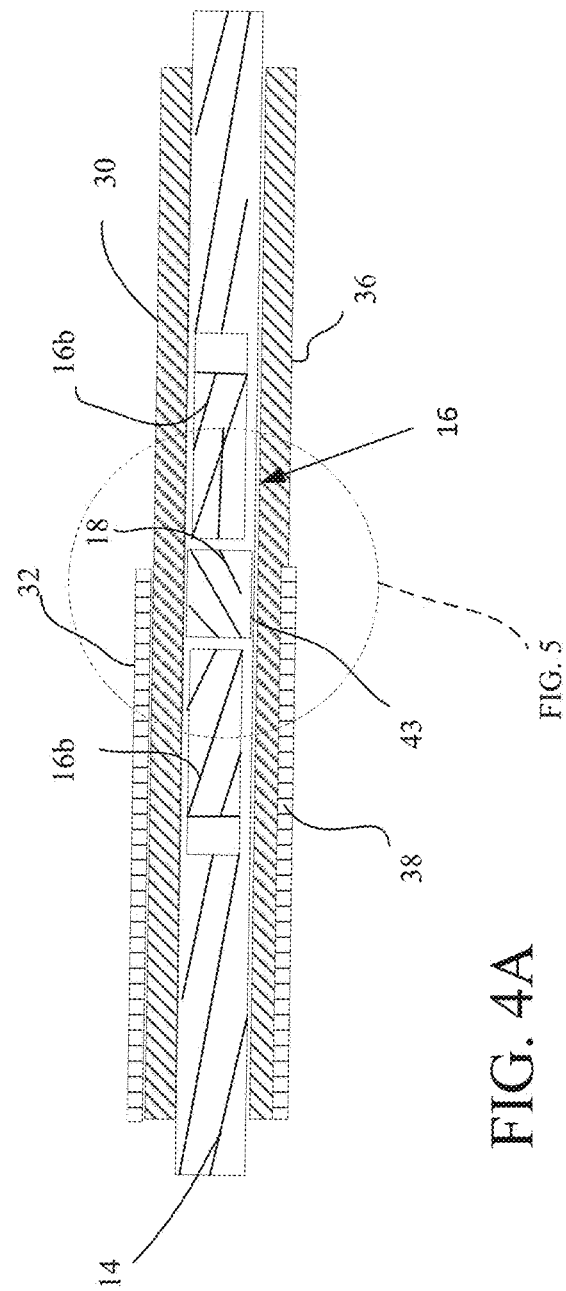

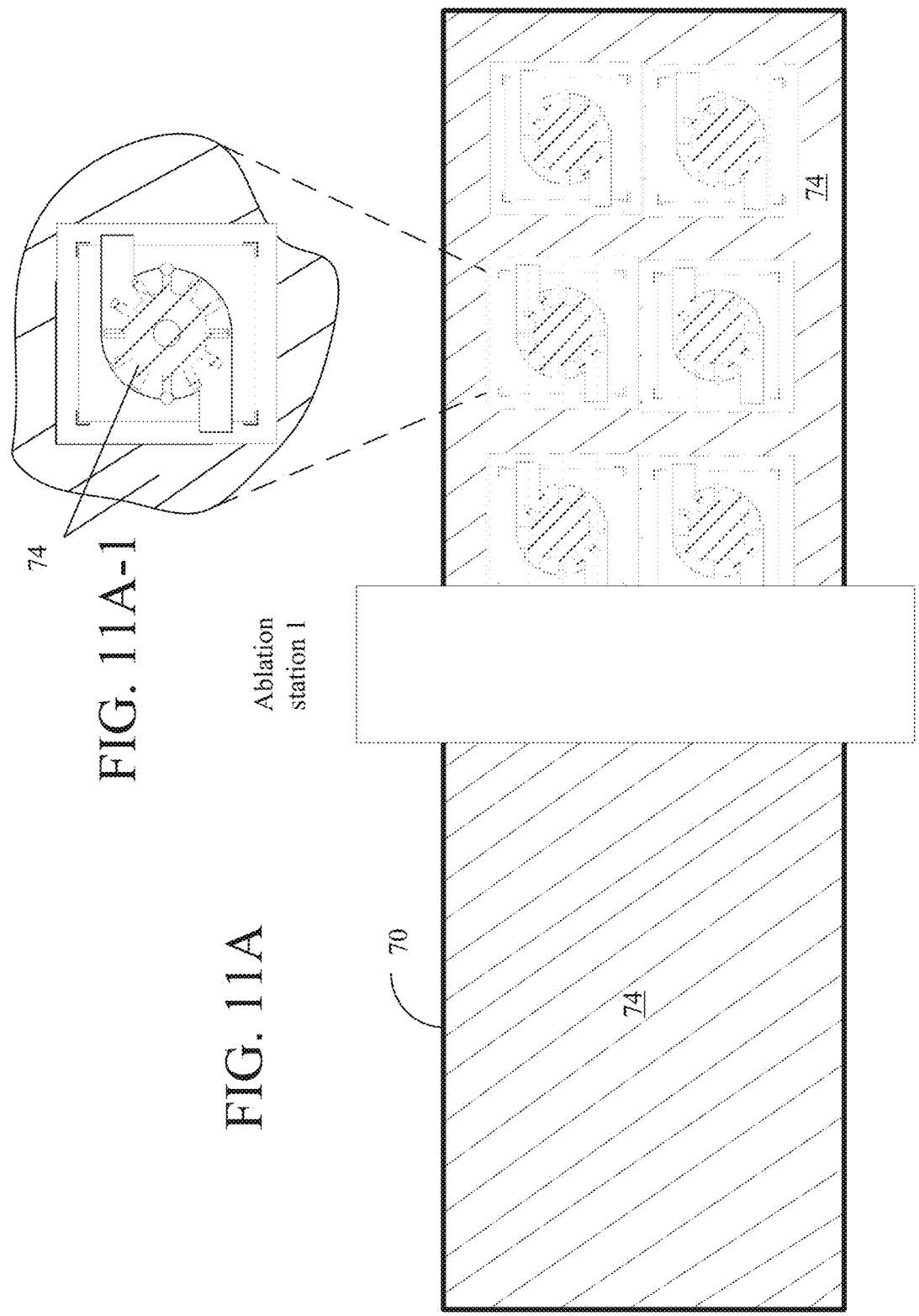

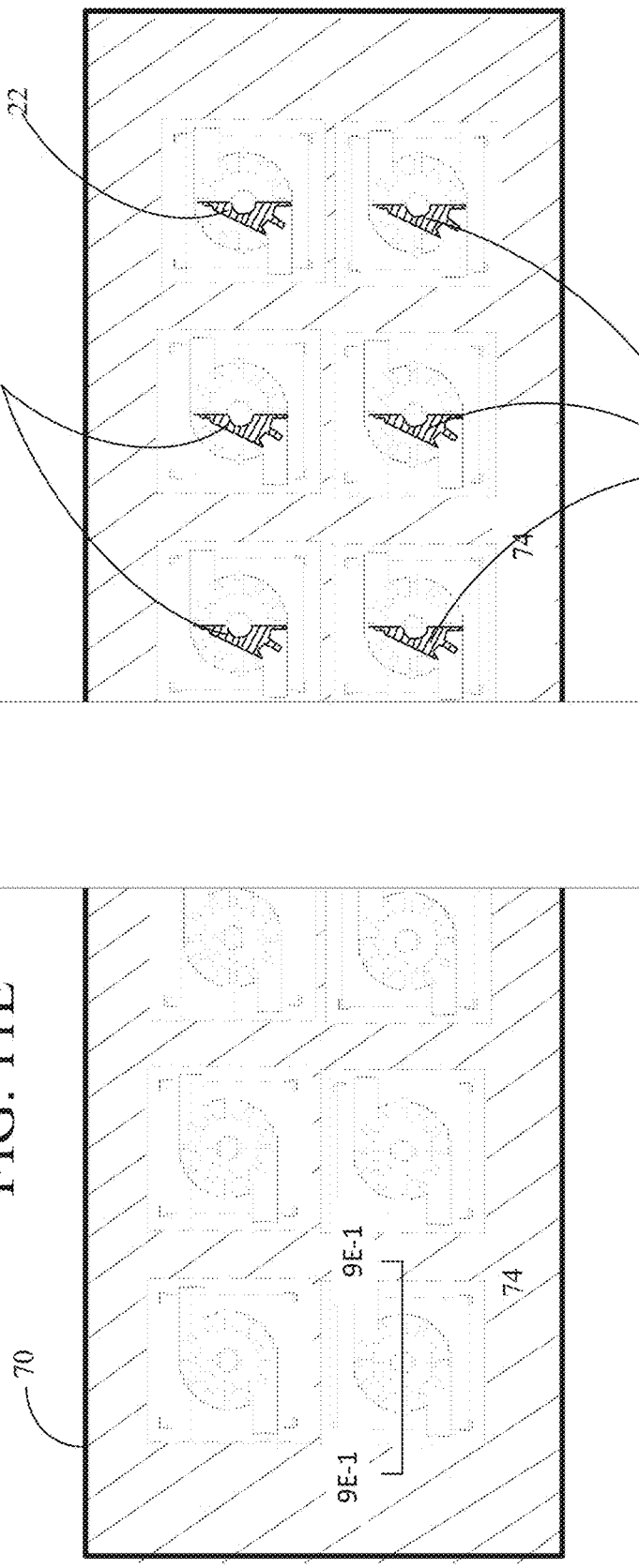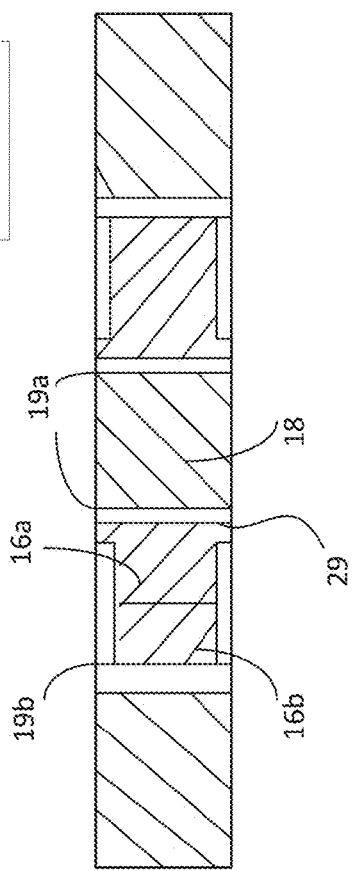

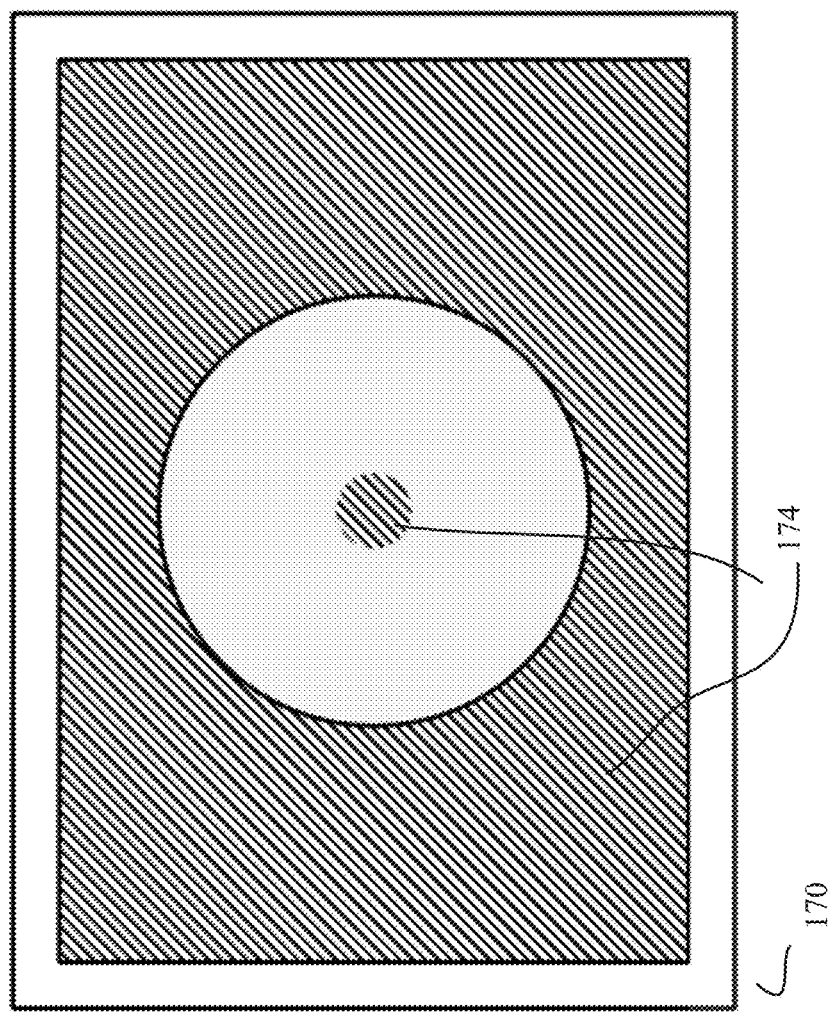

US 10,739,170 B2

MICRO FLOW MEASUREMENT DEVICES AND DEVICES WITH MOVABLE FEATURES

PRIORITY CLAIM UNDER 35 U.S.C. § 119

This application claims priority under 35 U.S.C. § 119 to U.S. Provisional Patent Application Ser. No. 62/541,128, filed Aug. 4, 2017, and entitled "Micro Flow Measurement Devices" and to U.S. Provisional Patent Application Ser. No. 62/585,641, filed Nov. 14, 2017, and entitled "Micro Devices with Moveable Features", the entire contents of which are hereby incorporated by reference.

BACKGROUND

This specification relates to flow measurement devices (also known as flow measurement sensors) and systems, as well as processing techniques to produce rotatable members by roll to roll processing.

Flow measurement devices produce a measure of an amount of fluid movement over a period of time. Various techniques are used for flow measurement. Flow measurement techniques include mechanical techniques that use pistons or gears. Other techniques include flow based meters that use a venturi or other orifices to constrict fluid flow in combination with a flow sensor to measure a differential flow before and within constriction.

These various techniques and technologies find use according to performance, application suitability and cost considerations. However, these techniques and resulting devices may not be suitable for some applications that require integration with other devices and/or systems. These techniques and resulting devices also may not be suitable for flow measurement applications that require low cost and high volume manufacture processing.

SUMMARY

The micro flow measurement devices described below can be made using micro fabrication methods and can be used for performing flow sensing for a variety of industrial, medical, and biological applications. In some instances it may be desirable for the micro flow measurement device to be capable of measuring not only flow rate but flow direction as well.

According to an aspect, a micro flow device includes a body having a chamber, and a first port and a second port having passages into the chamber, a first membrane over a first surface of the body, a first electrode on a portion of the first membrane, a second membrane over the second opposing surface of the body, a second electrode on a portion of the second membrane, an axle in the chamber affixed to the first and second membranes, a wheel member disposed in the chamber about the axle member, and spaced from the axle by a gap, and an interrupter feature disposed between the first and second membranes.

According to an additional aspect, a micro flow device includes a body having a chamber, a first port, and a second port that are coupled to passages into the chamber, an axle member disposed about a center of the chamber, a wheel member disposed in the chamber about the axle member, and spaced from the axle member by a gap having a narrow gap width, a first membrane of a flexible material over a first surface of the body having a first electrode on a portion of the first membrane, a second membrane over the second opposing surface of the body having a second electrode on a portion of the second membrane, and an interrupter feature that causes a change in a capacitance value between the first and second electrodes, as the wheel rotates.

The following are some embodiments within the scope of one or both of these aspects.

The micro flow device includes a first end cap connected to the first membrane and a second end cap connected to the second membrane, the first and second membranes of a flexible material having a thickness of several micros, the body comprised a flexible material have a thickness of a multiple of the thickness of the flexible material of the first and second membranes. The micro flow device has the interrupter feature as a structural feature of the wheel member that causes a change in capacitance between the first and the second electrodes, as the wheel member rotates. The micro flow device includes a capacitance measurement circuit coupled to the first electrode and the second electrode.

The micro flow device has the interrupter feature as a symmetric feature with respect to rotation direction of the wheel. The micro flow device further includes a capacitance measurement circuit coupled to the first electrode and the second electrode, with the electrode on the wheel member causing modulation of measured capacitance for rotation of the wheel member in a clockwise direction in comparison to rotation of the wheel member in a counter-clockwise direction, permitting the capacitance measurement circuit to discern flow rate but not fluid flow direction between the first and second ports.

The micro flow device has the interrupter feature as an asymmetric feature with respect to rotation direction of the wheel. The micro flow device has the interrupter feature on the wheel and includes a capacitance measurement circuit coupled to the first electrode and the second electrode, with the electrode on the wheel member causing substantially unequal modulation of measured capacitance for rotation of the wheel member in a clockwise direction in comparison to rotation of the wheel member in a counter-clockwise direction, permitting the capacitance measurement circuit to discern flow rate and fluid flow direction between the first and second ports.

The micro flow device of claim includes at least one additional micro flow device in a stack with the at least one micro flow device having an additional first electrode electrically connected to the first electrode and an additional second electrode electrically connected to the second electrode. The micro flow device has the wheel including a central core and a plurality of blades connected to the central core. The capacitance measurement circuit further includes a controller that converts measured capacitance from the capacitance measurement circuit into a flow value. The interrupter feature is one or more of an electrode, a set of slits a set of electrodes a set of apertures.

According to an additional aspect, a method of manufacturing a rotatable element, includes patterning a metal layer disposed on a first body sheet to produce a region of metal defining a rotatable element, patterning the first sheet to produce a body element having an interior wall that defines a chamber enclosing the rotatable element and an axle, with the rotatable element spaced from the interior wall of the body element by a first gap, and spaced from the axle element by a second gap, and a first set of bridge elements that tether the rotatable element to the body member, and a second set of bridge elements that tether the rotatable element to the axle member, laminating a first facial surface of a second sheet of a flexible material to a first facial surface of the first sheet to affix the second sheet to the body element and to the axle and a second facial surface of the second sheet having a electrode affixed to the second sheet, and patterning the conductive element on the second sheet to provide a first electrode.

The following are some embodiments within the scope of this aspect.

The method further includes laminating a third sheet of a flexible material to a second facial surface of the first sheet to affix the third sheet to body element and the axle element, the third sheet having an electrode affixed to the second sheet and patterning the conductive element on the third sheet to produce a second electrode. Patterning further includes patterning the first sheet to produce a pair of ports through the body element. The method forms a first repeatable layer, and the method further includes producing a plurality of additional repeatable layers including a second repeatable layer, and stacking the second repeatable layer on the first repeatable layer. The method after laminating includes removing the first and second set of bridges. The method further includes patterning a second metal layer disposed on the wheel element to define an interrupter element.

According to an additional aspect, a method of manufacturing a rotatable element includes patterning an adhesive layer disposed on a first surface of a first sheet of a flexible material to remove portions of the adhesive layer in an area to define a location for a rotatable element; patterning the first sheet to define the rotatable element in the first sheet, adhering a pair of membrane layers of a second flexible material, to opposing surfaces of the patterned first sheet, with each of the pair of membrane layers having an electrode, patterning the electrode on each of the pair of membrane layers to provide a first and a second electrode, respectively, and adhering a pair of sealing layers to surfaces of the pair of membrane layers.

The following are some embodiments within the scope of one or both of these aspects.

Patterning the first sheet further comprises patterning one area of the first sheet to define a chamber and an axle element, and the rotatable element disposed about the axle element, with the rotatable element spaced from the interior wall of the chamber by a first gap and spaced from the axle element by a second gap, and having a first set of bridge elements that tether the rotatable element to the body member and a second set of bridge elements that tether the rotatable element to the axle member. Patterning further includes patterning the first sheet to produce a pair of ports through the body element that provide a passageway into the chamber. The rotatable element is a wheel. After adhering the sealing layers the method further includes removing the first and second set of bridges. The method further includes forming an interrupter element on the wheel.

The micro flow measurement devices are fabricated using reasonably inexpensive techniques and thus provide inexpensive micro flow measurement devices for various applications. Two different types of micro flow devices are described. One type of micro flow measurement device is a unidirectional type that enables measurement of flow rate, but not flow direction. The other type is a directional type that measures flow rate and flow direction. This directional type of micro flow device can provide a measurement of fluid flow rate and an indication of flow direction, i.e., the direction at which fluid is flowing into the micro flow device.

In particular embodiments, the micro flow measurement devices described below are fabricated using roll to roll manufacturing techniques. Roll to roll manufacturing techniques provide large volume manufacturing capabilities with relatively low cost and can be used to integrate micro flow measurement devices with other devices and systems.

The details of one or more embodiments of the invention are set forth in the accompanying drawings and the description below.

Other features, objects, and advantages of the invention are apparent from the description and drawings, and from the claims.

DESCRIPTION OF DRAWINGS

FIG. 2A is a cross-sectional view of FIG. 2.

FIG. 4A is a cross-sectional view of FIG. 4 showing a top facial surface layer that was omitted for clarity in the view of FIG. 4.

FIGS. 11A-11F are views of roll to roll processing for the structure of FIG. 4.

FIG. 11A-1 is an enlarged view of a portion of FIG. 11A.

FIG. 11E-1 is an enlarged view of a portion of FIG. 11E.

FIGS. 12A-12J are views of an alternative roll to roll processing for producing rotatable features and the structure of FIG. 4.

DETAILED DESCRIPTION

Overview

Micro flow sensors/devices described herein are made using micro fabrication methods and can be used for measuring fluid flow and flow rates in various industrial, commercial, medical, and biological applications. Micro flow sensors/devices are fabricated on a micron/millimeter scale. Several fabrication techniques are disclosed.

In addition, two different types of micro flow devices are described. One type of micro flow measurement device is a non-directional type that enables measurement of flow rate, but not flow direction. The other type is a directional type that provides an indication of fluid flow direction, i.e., the direction at which fluid is flowing into micro flow device (e.g., which port of the device is receiving fluid), in addition to fluid flow rate.

Figure 1:
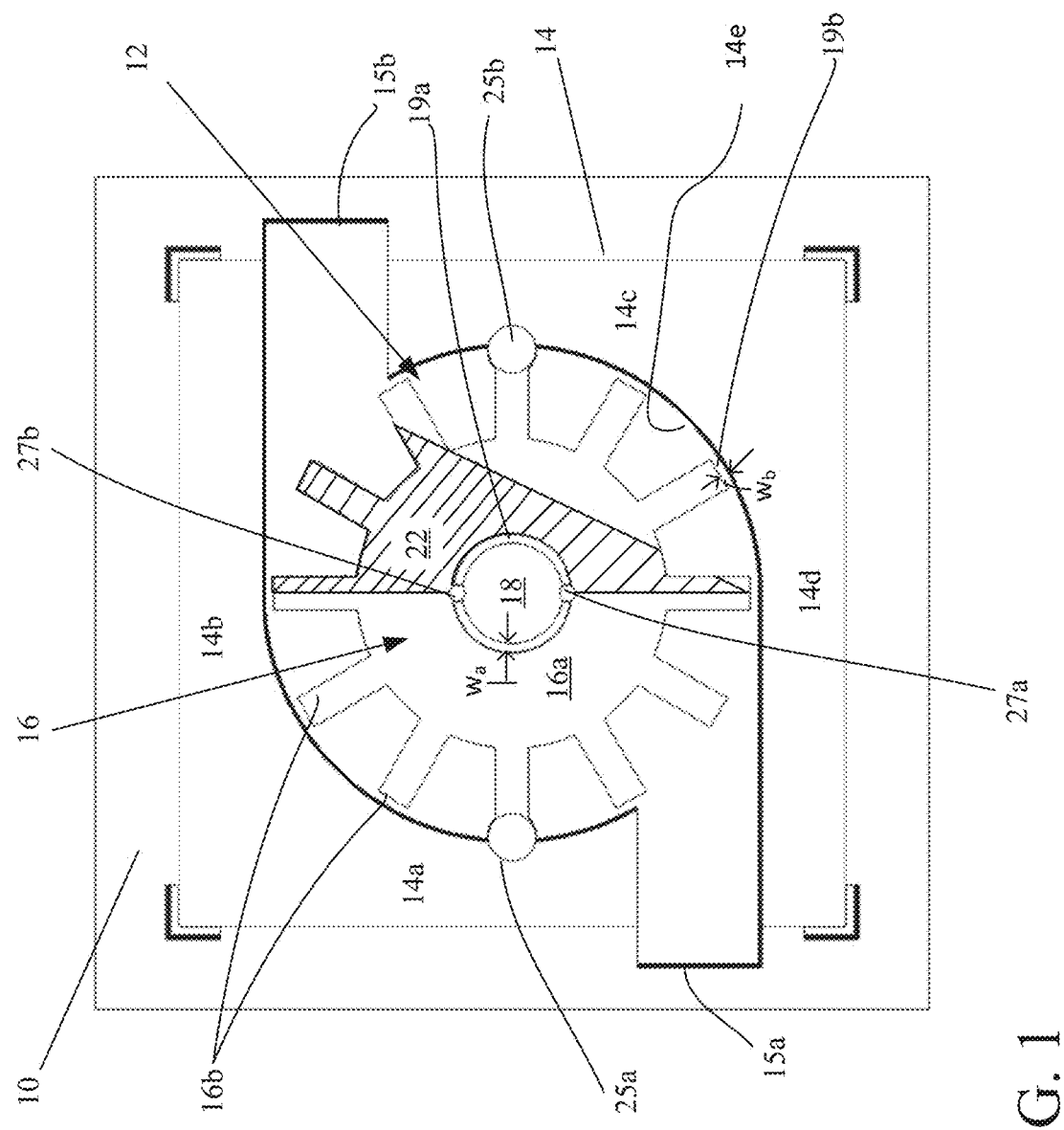
FIG. 1 is a plan view of a flow device in a stage of construction.

Referring to FIG. 1, a micro flow device 10 in a stage of construction is shown. The micro flow device 10 shown is a directional micro flow device that senses fluid flow direction and fluid flow rate. The micro flow device 10 is shown on a carrier layer, e.g., a web (for roll to roll processing discussed below) and includes a single circular flow chamber 12. (A micro flow device 100 would also include a single circular flow device chamber, as will be discussed in conjunction with FIG. 8). This initial discussion will use the micro flow device 10 as an example to explain certain details and principles of operation of either type of micro flow device.

The micro flow device 10 includes a flow device body 14 having plural external walls, e.g., four walls 14a-14d that define a body frame having an interior circular surface 14e defining the circular flow chamber 12. Two of the walls, e.g., walls 14a, 14c have ports 15a, 15b that provide fluid ingress or egress from an external fluid source and an external fluid sink (not shown) via passages (not referenced) into the chamber.

During certain times of operation one of the ports 15a, 15b, e. g., port 15a, acts as an inlet to a fluid flow and the other one of ports 15a, 15b, e.g., port 15b acts as an outlet to fluid flow. At other times of operation the opposite one of the ports 15a, 15b, e. g., port 15b, acts as an inlet to a fluid flow and the other one of ports 15a, 15b, e. g., port 15a, acts as an outlet to fluid flow. The micro flow device 10 provides an indicator that distinguishes between fluid flow that is into port 15a and out of port 15b vs. fluid flow into port 15b and out of port 15a. That is, the micro flow device 10 can detect fluid flow direction. While the ports are shown on opposing sides of the micro flow device 10, in some embodiments, the ports could be on adjacent sides or the same side.

The micro flow device 10 also includes a wheel 16 that is rotatable about a fixed axle 18. The wheel 16 has a central core 16a that is spaced from the fixed axle 18 by a relatively small gap 19a. By relatively small gap is meant that the gap has a width (w) that is of a size sufficient to allow the wheel 16 to rotate about the fixed axle 18 with minimum wobble and vibration. Thus, the gap width ($w_a$) size is of nanometers in size, sufficiently large so that the central core 16a is not attached to the fixed axle 18 and yet sufficiently small such that the wheel 16 can rotate without substantial wobble to minimize vibration.

The wheel 16 has plural blades (can also be described as vanes, fins, paddles, etc.) 16b that are attached to, e.g., part of, the central core 16a. The blades 16b can be straight or curved and the blades 16b are affixed to the central core 16a at any interior angle (between the blade and core) greater than zero degrees. A suitable range is 30 degrees to 90 degrees. Another suitable range is 45 degrees to 90 degrees. Ideally, the blades 16b attach to the central core 16a at a 90 degree angle, especially for the directional micro flow device 10. Ends of the blades 16b of the wheel 16 are spaced from the interior circular wall of body member 14 by a second relatively small gap 19b that would in general be similar in gap width size $w_b$ as the gap 19a, e.g., of a size sufficient that allows the wheel 16 to rotate about the fixed axle 18, without the blades 16b being interfered with by the interior surface 14e of the body member 14.

Also shown in FIG. 1 are bridge members 25a and 25b that are round bridge elements patterned from material that provided the device body 14. These bridge members 25a and 25b tether the wheel 16 to the flow device body 14 during stages of fabrication of the micro flow device 10. Also shown in FIG. 1 are bridge members 27a, 27b that tether the axle 18 to the wheel 16 during fabrication. Also shown in FIG. 1 are dice indicators (heavy corner lines, not referenced) that are used in dicing or cutting peripheral portions of the device body material to free the micro flow device 10 from those portions of the device body material upon completion of fabrication.

The wheel 16 includes one or more interrupters 22 (e.g., patterned conductor 23) that allow the wheel 16, while rotating between a pair of electrodes (not shown in FIG. 1) to modulate a bulk capacitance characteristic that exists between the pair of electrodes (not shown in FIG. 1). This modulation caused by the interrupter 22 provides an indication of flow rate, as discussed below. This particular interrupter feature is asymmetric and thus cases an asymmetric modulation that allows differentiation between clockwise and counter clockwise rotation of the wheel 16 and thus also provides an indication of flow direction, as discussed below.

Interrupter features can be of various types, e.g., anything that allows one part of the wheel 16 to have different electrical properties than another part of the wheel 16. Examples of interrupters 22 include different dielectric properties on portions of the wheel, holes in one side of the wheel, making one portion of the fins fatter or narrower on one side of wheel from the fins on the other side (while still balancing the wheel). The interrupter 22 can provide a difference in dielectric between a first portion of the wheel and a second portion of the wheel. Asymmetric interrupters 22 can also be of various types, e.g., anything that allows one part of the wheel 16 to have different electrical properties than another part of the wheel 16 and provide asymmetric modulation according to the wheel 16 rotation direction.

One interrupter 22 is a patterned metallic layer (or electrode) 23 provided on a first portion of the wheel 16, with the remaining portion of the wheel having no metal, as shown in FIG. 1. If the patterned electrode 23 is asymmetrical as shown, the wheel when rotating will produce a faster rate of change in capacitance in one rotation direction of the wheel 16, in relation to the opposite rotation direction of the wheel. A patterned conductor that occupies less than 50% (or conversely a patterned conductor that occupies more than 50%) will provide a larger change in capacitance than patterned conductor that occupies 50%. The changes in capacitance are distinguished according to direction of rotation of the wheel 16. This difference allows the flow device 10 to sense flow. When the difference is asymmetrical, this asymmetric difference also allows the device to sense flow direction in addition to flow rate.

Figure 2:
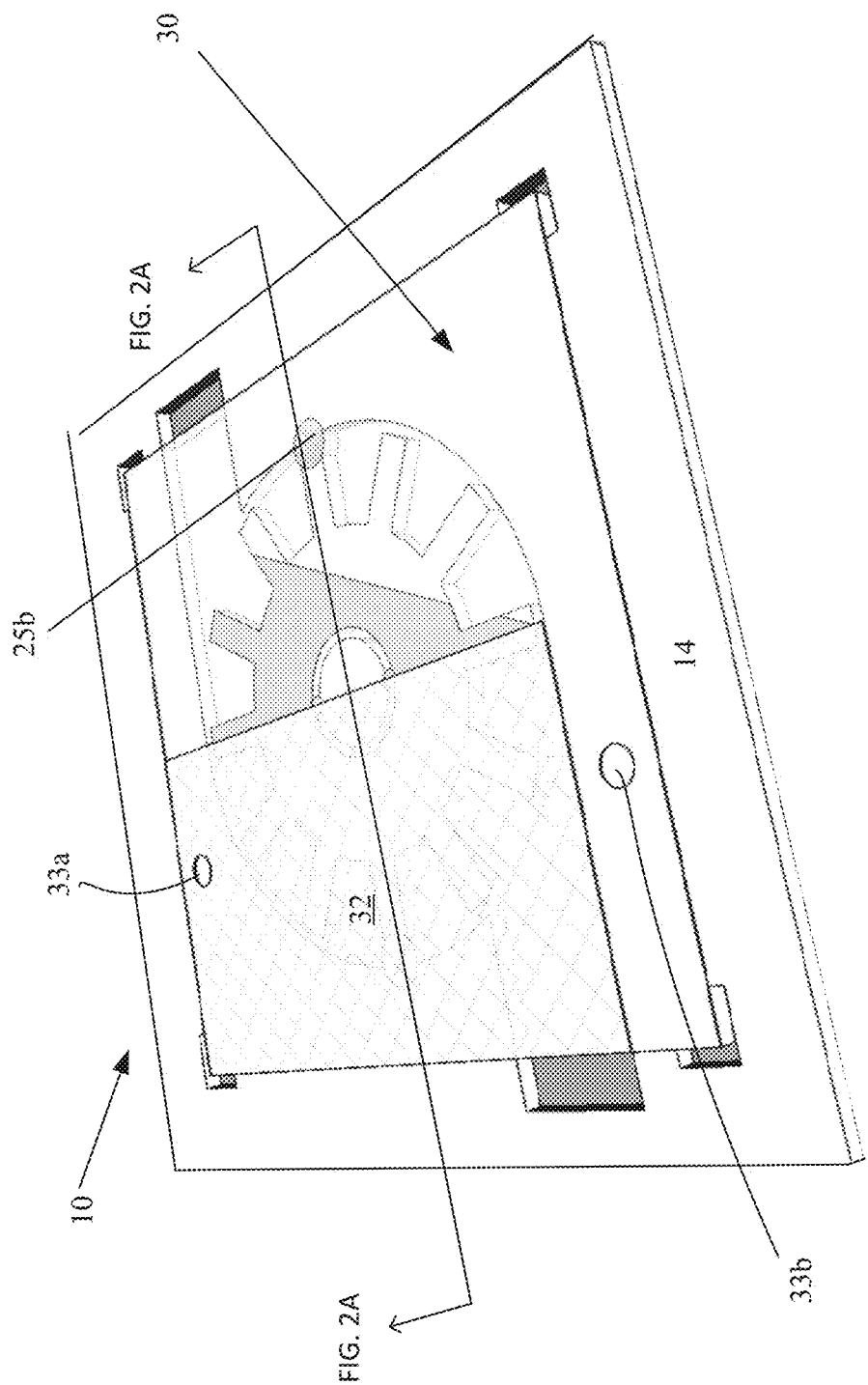
FIGS. 2-3 are perspective views of the micro flow device showing opposing facial surfaces in stages of construction of the micro flow device.

Referring to FIG. 2, on one facial surface (bottom surface in FIG. 1) of the flow device body 14 of the micro flow device 10 is a first membrane 30 supporting a first conductor layer 32. The first conductor layer 32 is disposed over a first one 33a of a pair of vias 33a, 33b to make electrical contact between the first conductor layer 32 and a measurement device (not shown). Also shown in FIG. 2 is bridge member 25b.

Referring to FIG. 2A, a cross-sectional view through the micro flow device 10 as depicted in FIG. 2, shows the first membrane 30 supporting the first conductor layer 32 on the device body 14 (shown slightly exploded for clarity). Also shown in FIG. 2A is a portion the electrode 23 on a portion of one of the blades 16b of wheel 16, bridge members 25a, 25b axle 18. Also shown in FIG. 2A is an optional adhesive spot 42 (depending on construction technique employed) that adheres an end of the axle 18 to membrane layer 30.

Figure 3:
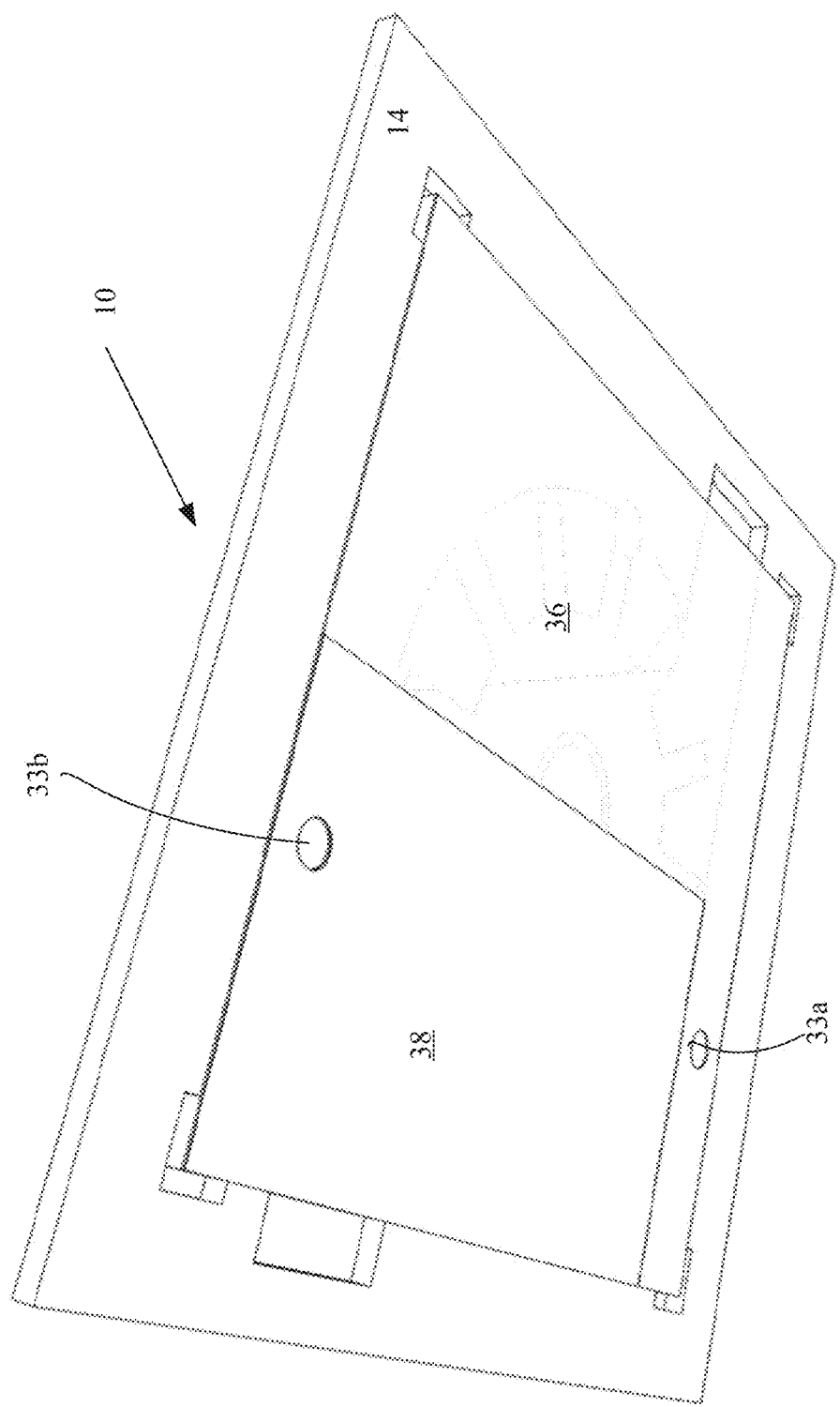

Referring to FIG. 3, on the opposing facial surface (top surface in FIG. 1) of the flow device body 14 of the micro flow device 10 is a second membrane 36 supporting a second conductor layer 38. The first conductor layer 32 is disposed over the second one 33b of the pair of vias 33a, 33b to make a second electrical contact between the second conductor layer 38 and a measurement device (not shown). On the opposing or (top surface) is a second membrane supported by a second spacer layer (both not shown in FIG. 1).

Figure 4:
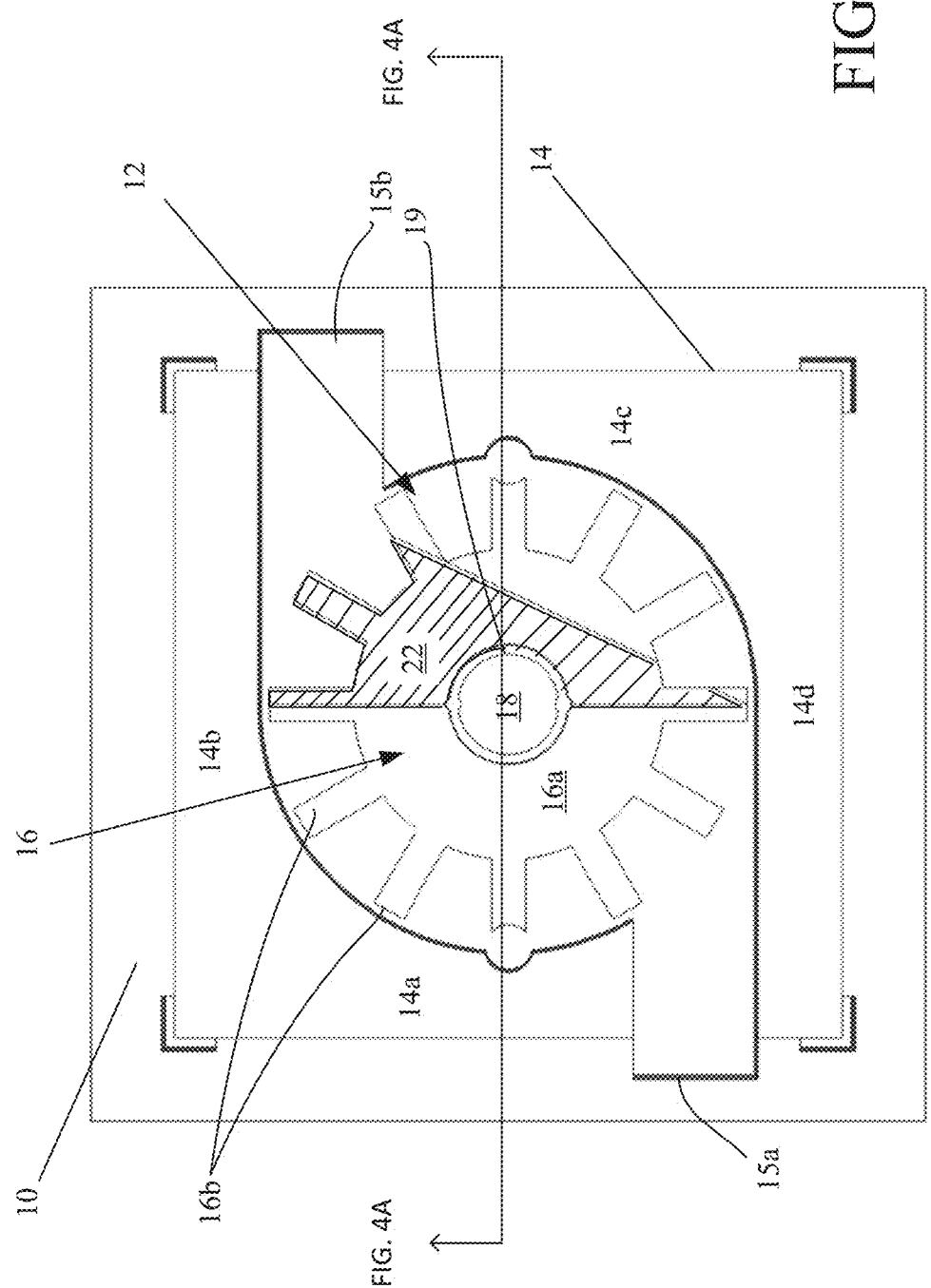
FIG. 4 is an assembled plan view of the micro flow device based on the concepts described in FIGS. 1-3 without a top facial surface layer.

Referring to FIG. 4, the micro flow device 10 in a final stage of construction is shown (but with the membrane 30 and electrode 32 not shown for clarity). The micro flow device 10 has the single circular flow device chamber 12, the ports 15a, 15b and the wheel 16 rotatable about a fixed axle 18 as bridge member sets 25a and 25b (FIG. 1) have been removed. Bridge members 25a and 25b were used to tether the wheel 16 to the flow device body 14 during fabrication, and bridge members 27a, 27b were used to tether the axle 18 to the wheel 16 during fabrication. With the bridges removed, the wheel 16 is free to rotate about the fixed axle 18 confined by layers 30 and 36.

Referring to FIG. 4A, a cross-sectional view through the micro flow device 10 as depicted in FIG. 4, shows the features of FIG. 2A, e.g., the first membrane 30 supporting the first conductor layer 32. The first membrane 30 is on the device body 14 in intimate contact with the device body portions and the axle 18. Also shown in FIG. 4A are the features from FIG. 3, such as the membrane 36 and electrode 38 (with optional adhesive spot 42 and adhesive spot 43). The bottom surface of the device body 14 is in intimate contact with the membrane 36 that supports electrode 38. These membranes 30, 36 on the device body 14 affix the axle 18 between the membranes 30 and 36, while leaving the wheel 16 and wheel blades 16b free to rotate about the axle 18.

In some embodiments the wheel 16 can be thinned. In some embodiments, as discussed in FIGS. 11A-11F, the free rotational movement of the wheel 16 about the fixed axle 18 relies on the recognition that during lamination of plastic layers, plastic will not laminate to metal based on conditions that will be employed by subsequent lamination techniques. However, under these conditions plastic will stick to underlying plastic. The defined conditions include heat, pressure and time that during lamination are sufficient to cause the plastic to stick to the underlying plastic without melting the PET. In some other embodiments, as discussed in FIGS. 12A-12J, the free rotational movement of the wheel 16 relies on the recognition that during lamination of plastic layers, plastic will not laminate to metal based on conditions that will be employed by subsequent lamination techniques, as above but that the fixed axle 18 is fixed by the adhesive spots 42, 43.

Figure 5:
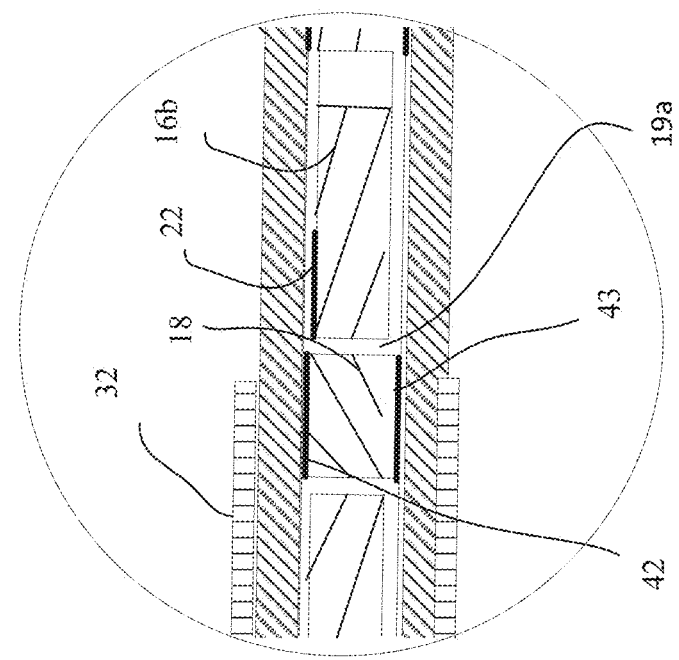
FIG. 5 is exploded view showing a portion of the micro flow device of FIG. 4A.

FIG. 5 shows an enlarged view depicting attachment of the axle 18 and body 14 to the membranes 32, 36, while the wheel 16 with the paddles 16b and the central core 16a are not attached to the membranes 32, 36. FIG. 5 also shows a portion of the electrode 23 on a portion of the central core 16a, as in FIG. 1.

Referring now also back to FIG. 1, the small gap 19a allows the wheel 16 to rotate about the fixed axle 18 when a fluid flows through one of the ports 25a or 25b (FIG. 1). The blades 16b of the wheel 16 are impacted by the fluid flow causing the wheel 16 to rotate about the axle 18. As mentioned, the wheel 16 has one or more features that allow the wheel 16 while rotating between electrodes 32 and 38 to modulate the bulk capacitance characteristic between the electrodes 32 and 38.

The bulk capacitance of the micro flow device 10 is the effective capacitance of a capacitor that is provided by the combination of the electrodes 32 and 38 and the dielectric constants of the membranes 30 and 36 dielectric of the material of the wheel, and the distance between the electrodes 32 and 38 and, is at least approximated by a formula for a parallel plate capacitor, given as:

$$C = \varepsilon_r \varepsilon_0 A/d,$$

where

C is the capacitance, in farads;

A is the area of overlap of the two electrodes, in square meters;

$\varepsilon_r$ is the dielectric constant of the material between the electrodes (sum of dielectric constants of a membrane, material of the wheel, and fluid);

$\varepsilon_0$ is the electric constant ($\varepsilon_0 \approx 8.854 \times 10-12$ F·m−1); and d is the separation between the plates, in meters, where d is sufficiently small with respect to the smallest chord of A.

The modulation occurs by including one of the aforementioned interrupter features. Consider the patterned electrode 23 as the interrupter feature. As the wheel turns the patterned electrode cuts into and out of the spacing between electrodes 32 and 38. Since the electrode 23 is a conductor the overlap of the electrode 23 with the electrodes 32 and 38 changes the spacing and overlap between electrodes 32 and 38, thus modulating the capacitance.

In FIG. 1, the electrode 23 on the wheel is asymmetric with respect to the entire wheel, i.e., the surface of the wheel 16 covered by the electrode 23 is smaller than and differently shaped from the remaining surface of the wheel 16. The electrode 23 on the wheel is also asymmetric with respect to itself, meaning that an outer peripheral portion of the electrode has a longer chord than the inner peripheral portion of the electrode 23. This arrangement affects the shape of a waveform that is generated by circuity that measures the capacitance.

Figure 6:
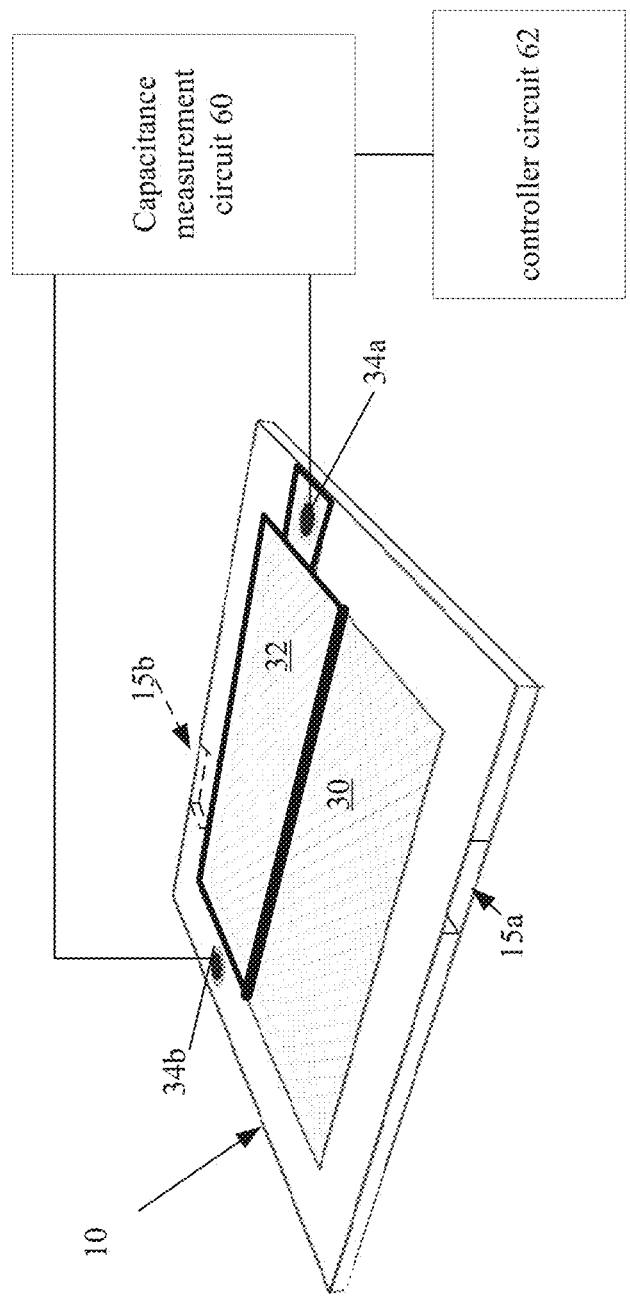
FIG. 6 is an isometric view of the modular micro flow device of FIG. 4 with the top cap coupled to capacitance measurement circuitry.

Referring now to FIG. 6, a capacitance measurement circuit 60 is attached to electrodes 34a, 34b of the micro flow device 10. The capacitance measurement circuit 60 delivers voltages to the electrodes (only electrode 32 on membrane 30 shown in this view) according to the type of capacitance measurement circuit employed. In some examples of a capacitance measurement circuit an AC waveform can be used and the capacitance is measured using frequency domain techniques. In other examples of a capacitance measurement circuit a DC waveform is used to measure capacitance using time domain techniques.

The capacitance measurement circuit 60 delivers an output train of pulses that is proportional to the capacitance measured. A controller 62 converts these pulses to a capacitance value that is translated to a flow rate and flow direction. The output will be a value that represents the bulk capacitance between the electrodes 32 and 38 (not shown in FIG. 6, which is modulated by the rotation of the wheel 16 and the electrode 23 cutting into and out of a region of overlap with the electrodes 32 and 36. If the interrupter 22 is symmetric the modulation will likewise be symmetric. However, if the interrupter 22 is asymmetric as is electrode 23 the output will likewise be asymmetric.

Figure 7:
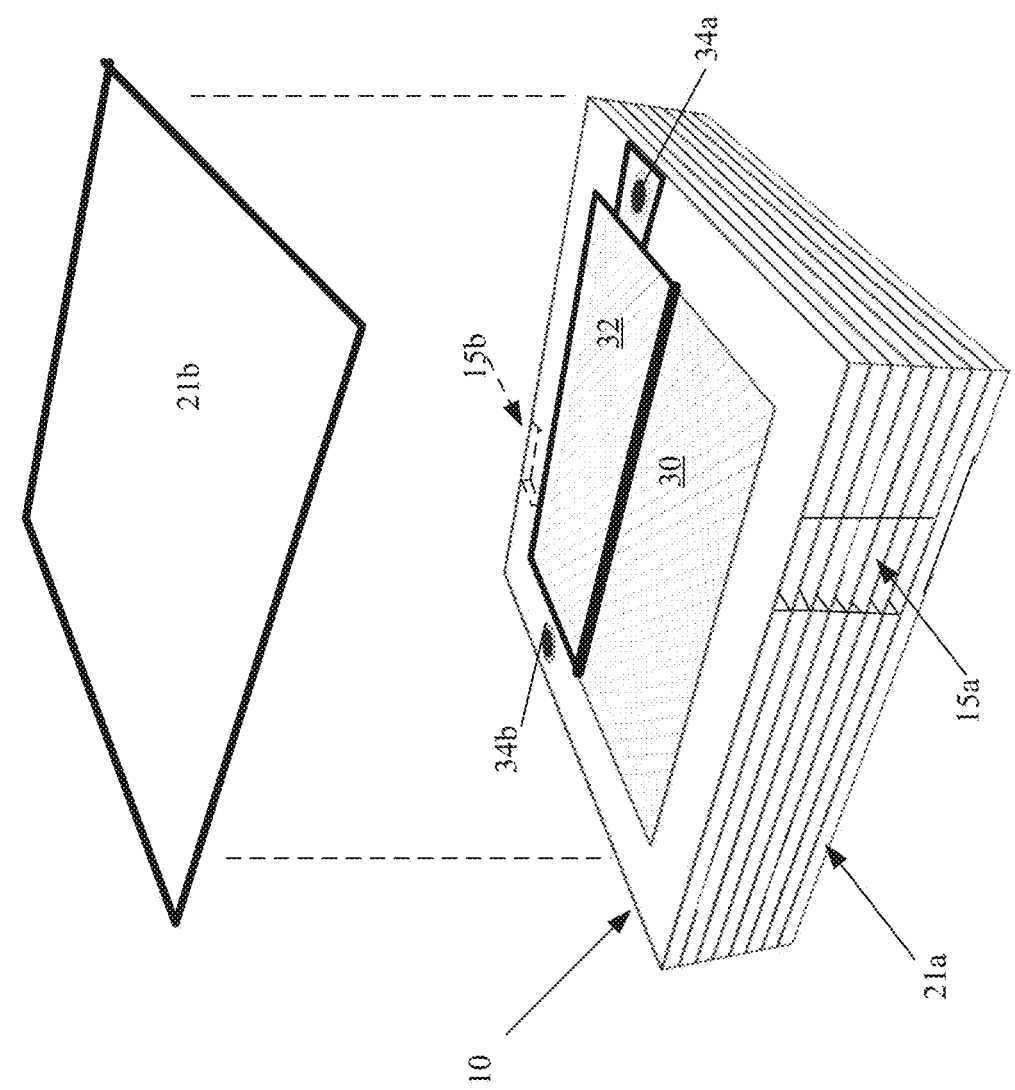
FIG. 7 is an isometric view of a micro flow device comprised of stacked repeatable layers.

Referring to FIG. 7, a stacked arrangement 10' of flow devices 10 is shown. On the top of the stacked arrangement is shown the device of FIG. 6. Below micro flow device 10 are like micro flow devices 10 that are arranged in the stacked arrangement 10' with ports 15a shown in alignment. In some implementations ports 15a can be staggered (meaning that with the stack vertically adjacent ports are offset one from the other). A bottom end cap 21a is shown attached to the stacked arrangement 10 and a top end cap 21b is shown in exploded view over the stacked arrangement 10 but which would be affixed to the stacked arrangement 10'. Similar end caps 21a, 21b would be used with the flow device of FIG. 6.

Figure 8:
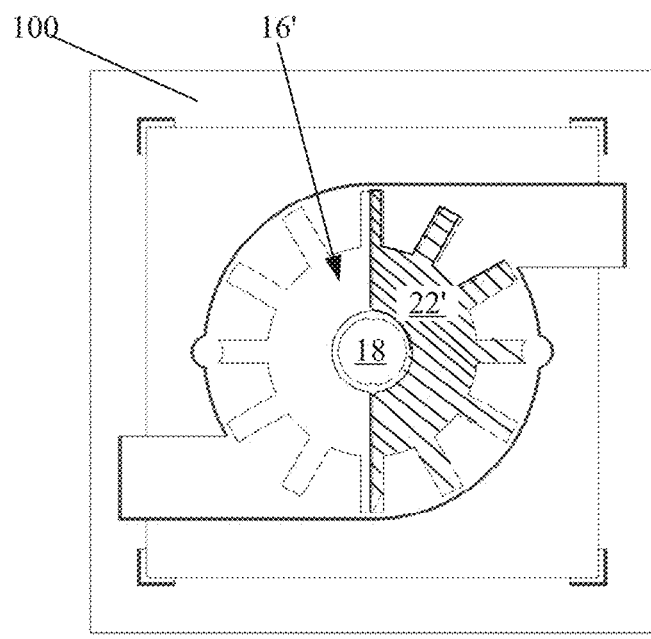
FIG. 8 is a plan view of a unidirectional micro flow device.

Referring to FIG. 8, a unidirectional micro flow device 100 and stacked arrangement 100' of unidirectional flow devices 100 are shown. The unidirectional micro flow device 100 is basically the same in construction as that of directional micro flow device 10 (FIGS. 1-4A) except for the symmetric interrupter 22' shown as a symmetric patterned layer on wheel 16'.

Figure 8A:
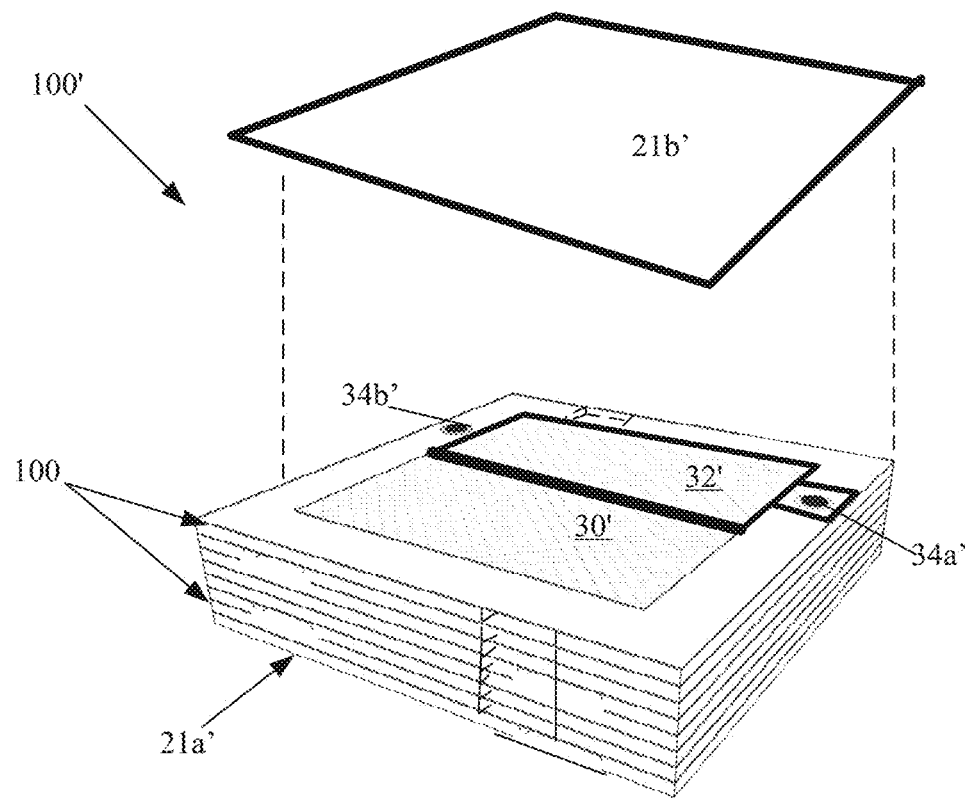
FIG. 8A is an isometric view of a unidirectional micro flow device comprised of stacked repeatable layers.

Referring to FIG. 8A, a stacked arrangement 100' of flow devices 100 is shown. On the top of the stacked arrangement is shown the device 100 of FIG. 8 with electrode 32' and via connections 34a, 34b on membrane 30 (similar to FIG. 2) that were not shown in FIG. 8. Below micro flow device 100 are like micro flow devices 100 that are arranged in the stacked arrangement 100' with ports (not referenced) shown in alignment. In some implementations ports can be staggered (meaning that with the stack vertically adjacent ports are offset one from the other). A bottom end cap 21a' is shown attached to the stacked arrangement 100 and a top end cap 21b' is shown in exploded view over the stacked arrangement 100 but which would be affixed to the stacked arrangement 100'. Similar end caps 21a', 21b' could be used with the flow device 100 of FIG. 8.

Figure 9A:
FIGS. 9A-9C are idealized plots of voltage vs. time.
Figure 9B:
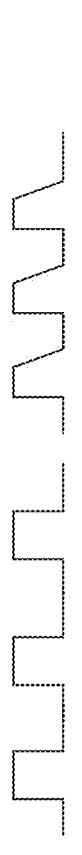
Figure 9C:

Referring now to FIGS. 9A-9C three fictitious outputs are shown that could be representative of outputs from a capacitance measurement circuit 60 for three different cases. The outputs are of voltage with respect to time.

FIG. 9A shows a first case using a symmetric interrupter 22' (as in FIG. 8). The symmetric interrupter (22' FIG. 8) would be any symmetric feature that modulates capacitance equally irrespective of fluid flow direction. One example is the electrode 23' having a symmetric pattern on the wheel 16' of FIG. 8. Thus, symmetric interrupter 22' would produce a series of pulses, e.g., typically close to a square wave output from the capacitance measurement circuit 60. The series of pulses would be proportional to flow rate, but would have symmetric pulse edges that would be substantially the same in either direction. Circuity would not be able to discern fluid flow direction from the series of pulses.

FIG. 9B shows a second case using the asymmetric interrupter 22 (electrode 23) of FIG. 1 rotating in a clockwise direction, indicating that the fluid flow ingress is at port 15b and egress is at port 15a. In this second case, the asymmetric interrupter 22 would produce from the capacitance measurement circuit 60, e.g., a series of pulses having leading edges with a short rise time and lagging edges with a long fall time (relative to the leading edge) that would be proportional to flow rate and would discern fluid flow direction as into port 15b.

FIG. 9C shows a third case using the asymmetric interrupter 22 (electrode 23) of FIG. 1 rotating in a counterclockwise direction, indicating that the fluid flow ingress is at port 15a and egress is at port 15b. In this third case, the asymmetric interrupter 22 would produce e.g., a series of pulses having leading edges with a long rise time and lagging edges with a short fall time (relative to the leading edge) that would be proportional to flow rate and would discern fluid flow direction as into port 15a.

The controller 62 that is either part of the capacitance measurement circuit 60 or a separate circuit references a table/algorithm to convert measured capacitance units into flow units. The circuitry 60 and/or controller 62 also discerns rise/fall times of edges (FIG. 9B and FIG. 9C) to discern rotation direction of the wheel 16 and hence fluid flow direction. Many techniques can be used to measure and detect changes in such capacitance over the bulk capacitance and rise and fall times.

Compared to a conventional flow device used for similar purposes, the micro flow device 10 may use less material, and thus is subject to less stress. The micro flow device 10 has a size in the micron to millimeter scale, and can provide wide ranges of flow measurements.

Micro flow device 10 having the above described features can be manufactured using various methods such as MEMS processing techniques and so-called roll to roll (R2R) processing. The materials for a micro flow device 10 are chosen based on the features to be provided by the micro flow device 10 and the method of manufacturing of the micro flow device 10. Below are some criteria for choosing the materials of the different parts of micro flow device 10.

Device body—The material used for the device body 14 may be defined by the requirements. In general, the material needs to be strong or stiff enough to hold its shape to produce the chamber. In some implementations, the material is etchable or photo sensitive so that its features, e.g., the wheel 16 and chamber 12, etc. can be defined and machined/developed. Sometimes it is also desirable that the material interact well, e.g., adheres, with the other materials in the micro flow device 10. Furthermore, the material is electrically non-conductive. Examples of suitable materials include SU8 (negative epoxy resist), and PMMA (Polymethyl methacrylate) resist.

Membrane—The material for this part can be an elastic material that forms a tympanic structure that along with the device body 14 confines the fluid in the chamber 12 and which supports the electrodes 32 and 38. As such, the material if elastic can bend or stretch back and forth, but such elastic characteristics are not required. The membrane material is impermeable to the fluids of interest, including gas and liquids, is electrically non-conductive, and can have either a low or a high breakdown voltage characteristic. Examples of suitable materials include silicon nitride, and Teflon. Others materials that are stiff are also possible.

Electrodes—The material of the electrodes is electrically conductive. Because the electrodes do not conduct significant amounts of current, the material can have a high electrical sheet resistance, although the high resistance feature is not necessarily desirable. The electrodes are subject to bending and stretching with the membranes, and therefore, it is desirable that the material is supple to handle the bending and stretching without fatigue and failure. In addition, the electrode material and the membrane material adhere well, e.g., do not delaminate from each other, under the conditions of operation. Examples of suitable materials include very thin layers of gold and platinum. Others such as aluminum are possible.

Electrical interconnects—The voltages from the capacitance measurement circuits are conducted to the electrode on each membrane of each chamber. Electrically conducting paths to these electrodes can be built using conductive materials, e.g., gold and platinum. Others such as aluminum are possible.

Other materials—when MEMS processing is used in manufacturing the micro flow device, a sacrificial filling material, e.g., polyvinyl alcohol (PVA), can be used. The sacrificial filling material may also be used in R2R processing. In some implementations, solvents are used in the manufacturing process, which may place additional requirements on the various building materials of the micro flow device. It may be possible to print some of the electrical circuit components onto the membranes. In general, while certain materials have been specified above, other materials having similar properties to those mentioned could be used.

End plates (not shown in the figures) can be placed above and below the finished device 10 to protect the electrodes and membranes from an ambient. The finishes device 10 can be packaged in various types of packages such as those used for integrated circuits and can be fitted with fittings on the ports.

Figure 10:
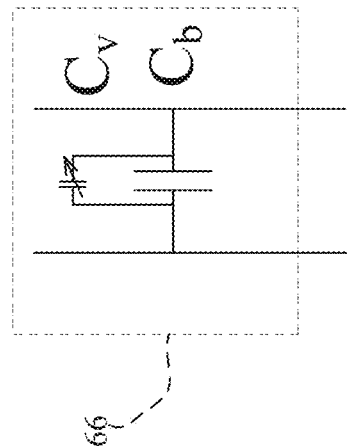
FIG. 10 is schematic view of simplified model of a micro flow device.

Referring now to FIG. 10, the flow device 10 can be electrically modeled 66 as a capacitor having a bulk capacitance value $C_b$ corresponding to a quiescent position of the electrode 23 being outside of a region between electrodes 32 and 38 and a variable capacitance value $C_v$ corresponding to rotation of the wheel in response to a fluid flow through the flow device 10. In FIG. 10, the model 66 is shown as having the bulk capacitance value $C_b$ and variable capacitance value $C_v$. Each of these "capacitors" are electrically connected in parallel. Capacitors connected in parallel have a total capacitance that is the sum of capacitances of the individual capacitors.

As mentioned above, while several approaches can be used to fabricate the micro flow device 10, such as MEMS processing (Microelectromechanical systems) techniques discussed below will be techniques for fabrication by roll to roll processing that can also be applied to formation of other types of devices/systems.

Roll to Roll Processing for Producing Micro Flow Devices

A roll to roll processing line can comprises several stations that can be or include enclosed chambers at which deposition, patterning, and other processing occurs. Processing viewed at a high level thus can be additive (adding material exactly where wanted) or subtractive (removing material in places where not wanted). Deposition processing includes evaporation, sputtering, and/or chemical vapor deposition (CVD), as needed, as well as printing. The patterning processing can include depending on requirements techniques such as scanning laser and electron beam pattern generation, machining, optical lithography, gravure and flexographic (offset) printing depending on resolution of features being patterned. Ink jet printing and screen printing can be used to put down functional materials such as conductors. Other techniques such as punching, imprinting and embossing can be used.

The original raw material roll is of a web of flexible material (not shown). In roll to roll processing the web of flexible material can be any such material and is typically glass or a plastic or a stainless steel. While any of these materials (or others) could be used, plastic has the advantage of lower cost considerations over glass and stainless steel. Specific materials will be determined according to the application of the micro flow device. In applications materials such as stainless steel or other materials that can withstand encountered temperatures would be used, such as Teflon and other plastics that can withstand encountered temperatures.

For the structure shown in FIGS. 1-7 and the structure shown in FIGS. 8, 8A, stations within a roll to roll processing line are set up according to the processing required. Thus, while the end cap and top caps could be formed on the web or plastic sheet in one implementation the end and top caps are provided after formation of the micro-flow device stack, as will be described.

The plastic web is used to support the body 14 (FIG. 4A) by a deposition of material on the web at a deposition station followed by patterning station. The body is formed at a forming station. The web supporting the body 14 has a membrane 30 deposited over the body 14 at a station. Over the membrane 30 is deposited an electrode 32 at deposition station which is patterned at patterning station. Membrane 30 with patterned electrodes 32 supported on the membrane 30 are provided on the body 14. Membrane 36 with patterned electrodes 33 supported on the membrane 36 are also provided on the body 14. Electrical interconnects, for connecting to the electrodes 32, 38 on each membrane 30, 36, are provided by depositing conductive materials, e.g., gold, silver, and platinum layers (or conductive inks such as silver inks and the like). In some implementations some of the electrical circuit components are printed onto the membranes 30, 36. The roll having the micro flow units (body and membranes with electrodes and electrical connections and caps) are diced and collected and packaged according to the application to provide the micro flow device 10.

Referring to FIGS. 11A-11D, a specific roll to roll processing approach to provide the micro flow device 10 is shown. A raw sheet of material is passed through plural stations to have features applied to the sheet and the sheet is subsequently taken up to produce fabricated micro flow devices.

Referring to FIG. 11A and FIG. 11A-1, a sheet 70 of a flexible material such as a glass or a plastic or a stainless steel is used as a web. For the particular implementation of the micro flow device 10, the material is a plastic sheet, e.g., Polyethylene terephthalate (PET), which is provided with a layer 74 of metal e.g., aluminum (Al) over a major surface of the sheet 70. The sheet 70 is a 50 micron thick sheet of PET (Teflon) that coated with a thin metal layer 74 of aluminum having a 100 A° (Angstroms) thickness. Other thicknesses could be used (e.g., the sheet 70 could have a thickness between, e.g., 25 microns and 250 microns (or greater) and the thickness of the layer 74 can be 50 A° to 500 A° (or greater). In general the body layer will have a thickness about 5 to 10 times that of membrane layer thicknesses. The thicknesses are predicated on desired properties of the microelectromechanical system to be constructed and the handling capabilities of roll to roll processing lines. These considerations will provide a practical limitation on the maximum thickness. Similarly, the minimum thicknesses are predicated on the desired properties of the microelectromechanical system to be constructed and the ability to handle very thin sheets in roll to roll processing lines.

The metal layer 74 is provided by various approaches, such as evaporation or other techniques. Such metalized films are also commercially available. The sheet 70 from a roll (not shown) with the layer 74 of metal is patterned at an ablation station, e.g., a laser ablation station 1. A mask (not shown) is used to configure the laser ablation station 1 to remove the metal layer 74 from those portions of the sheet 70 that will be used to form the body 14 and gap to the axle 18, while leaving metal 74 on portions of the sheet that will ultimately become moveable parts, e.g., the wheel 16. Optionally, the metal 74 can also be left on those extraneous portions of the sheet where the various structures are not fabricated, in order to save time/expense in unnecessary ablation.

The metal left on the sheet portions that will become the wheel 16 permit the wheel to rotate within the chamber 12. This technique relies on the recognition that during lamination of plastic layers as discussed below, the plastic will not laminate to the metal based on conditions that will be employed by subsequent lamination techniques. However, under these conditions the plastic will stick to underlying plastic. The defined conditions include heat, pressure and time that during lamination are sufficient to cause the plastic to stick to the underlying plastic by an electrostatic mechanism without melting the PET.

Figure 11B:
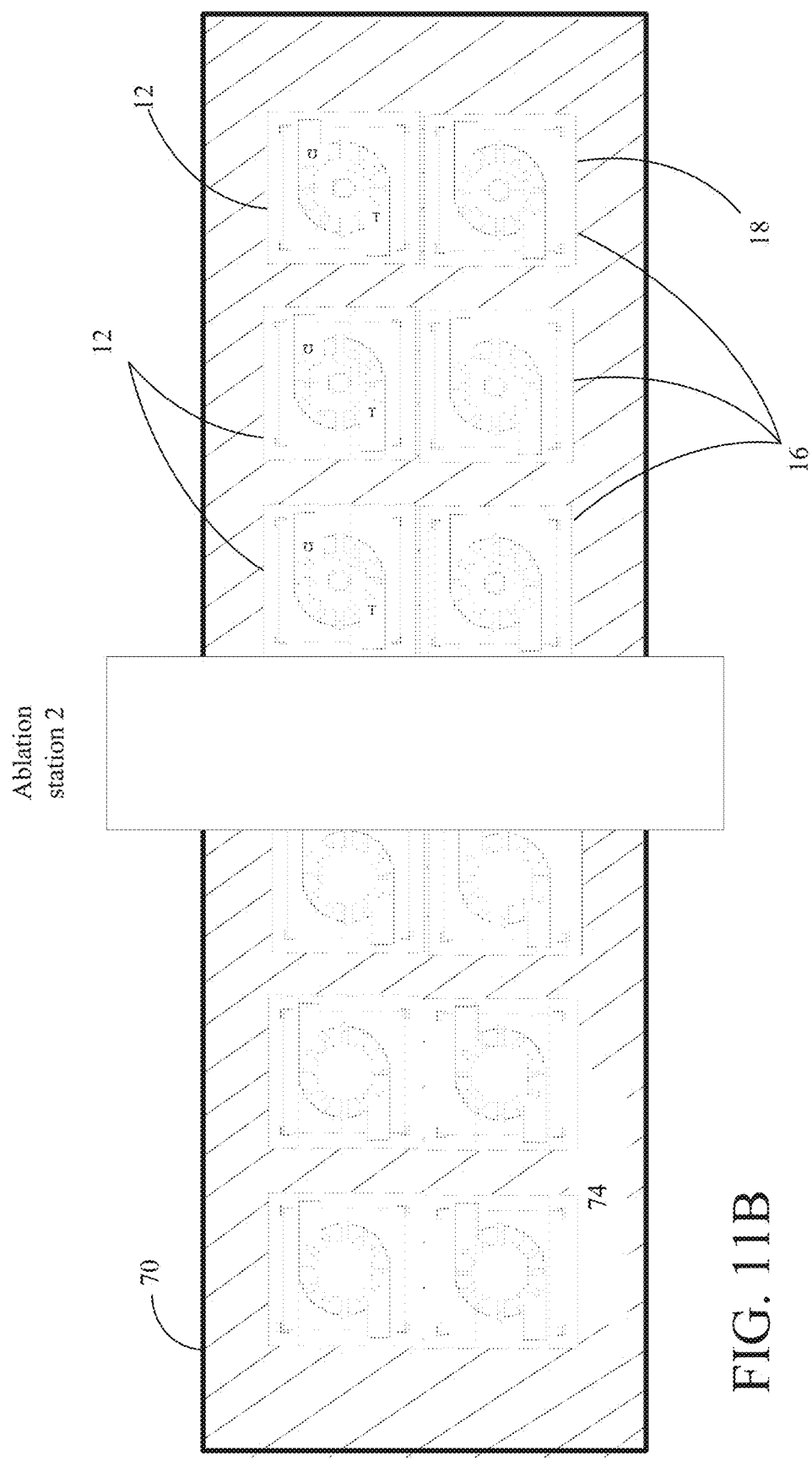

Referring now to FIG. 11B, the sheet 70 with the metal left 74 on sheet portions that will correspond to the wheel 16, and optionally on the extraneous portions, is micro-machined. A second mask (not shown) is used to configure a second laser ablation station to define or form the chamber and wheel. The sheet is micro-machined using a mask or direct write to configure a laser ablation station to define or form the chamber 12 and the wheel 16 tethered as discussed in FIG. 1. Vias are also provided for electrical connections. The micro-machining ablates away the plastic to form the chamber 12 within which sits the wheel 16, and defies the gap 19 to the axle 18 and defines the frame portion of the body 14.

Figure 11C:
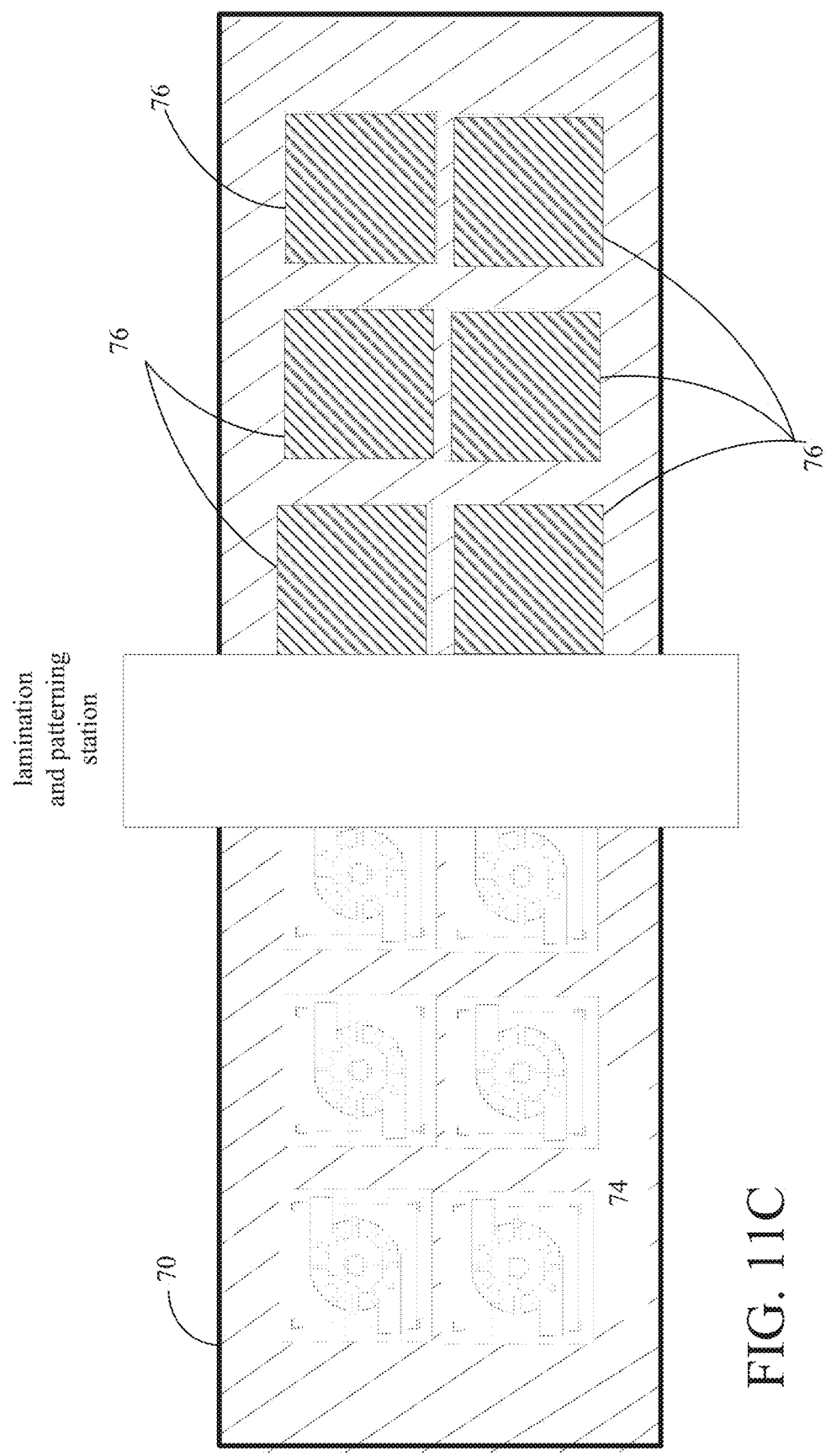

Referring now to FIG. 11C, the sheet 70 with the defined features of the wheel 16 and gap 19 to the axle 18, and the chamber 12 is laminated at a lamination station to a second sheet (shown as patterned regions 76), e.g., 5 micron thick sheet of PET, with a second metallic layer 310 of Al of 100 A on a top surface of the sheet. This second sheet shown as patterned regions 76 provides membranes over flow device bodies 14 provided by the defined features of the chamber 12 and wheel 16. The second sheet is also machined to provide alignment holes (not shown) prior to or subsequent to coating of the metallic layer.

Prior to lamination of the second sheet to the first sheet, the second sheet is also provided with several randomly dispersed holes or view ports (not shown) over some areas that will be in alignment with the body structures. These randomly dispersed holes are used by a machine vision system to reveal and recognize underlying features of the body units on the first sheet. Data is generated by noting the recognized features in the first sheet through the random holes. These data will be used to align a third ablation station when forming electrodes from the layer over the bodies.

The second sheet is laminated to and thus sticks (or adheres) to the first sheet in areas where there is plastic on the first sheet and plastic on the second sheet. At this point, a composite sheet of repeatable units of the micro flow device are formed, but without electrodes formed from the layer on the membrane.

The machine vision system produces a data file that is used by the laser ablation system in aligning a laser ablation station with a mask (or direct write) such that a laser beam from the laser ablation system provides the electrodes according to the mask, with the electrodes in registration with the corresponding portions of the bodies. The electrodes are formed by ablating away the metal in regions that are not part of the electrodes and conductors, leaving isolated electrodes and conductors on the sheet. The registration of the patterned electrodes to the body is thus provided by using the machine vision system to observe features on the front side of the laminated structure providing positioning data that the laser ablation system uses to align a laser beam with a mask, using techniques commonly found in the industry.

Figure 11D:
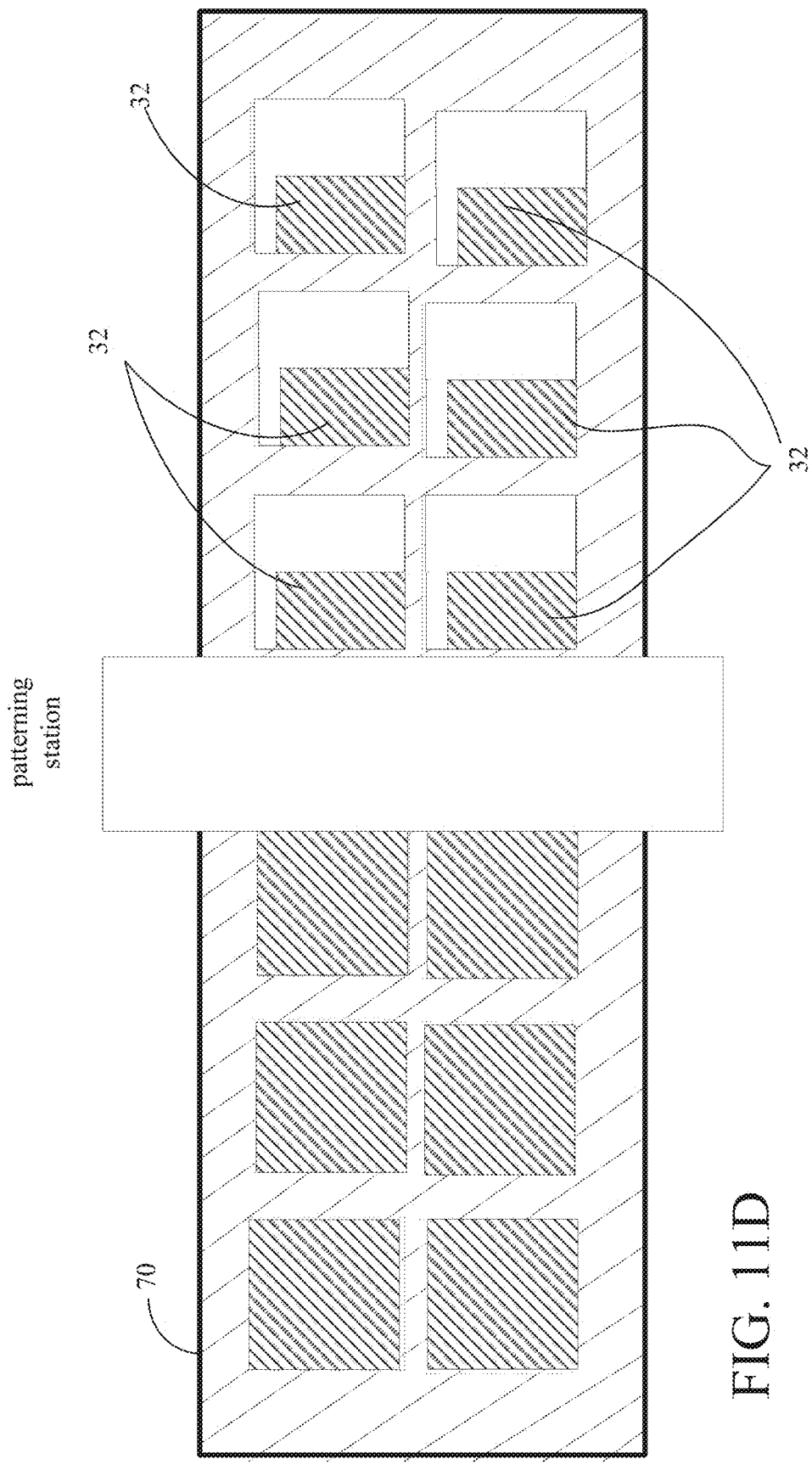

Referring now to FIG. 11D, the composite sheet 70 is fed to the laser ablation station, to form the electrodes by ablating the 100 A° Al layer deposited on the second sheet that formed the membrane. The composite sheet is patterned according to the mask to define the electrodes over corresponding regions of the body. The ablation station ablates away metal from the metal layer leaving isolated electrodes on the sheet.

Referring now to FIG. 11E, the sheet 70 from FIG. 11D is passed through a lamination and patterning station that applies an interrupter 22, e.g., placing holes through portions of the wheel (not shown) or by placing the electrode 22 on a portion of the wheel 16, as shown. In FIG. 11E, the electrode 22 is applied to the backside of the wheel 16.

In some implementations it may be helpful to thin the features that form the wheel, i.e., reduce the thickness of the wheel by a few hundred angstroms to ensure free rotation of the wheel. This can be accomplished either prior to lamination of the second sheet to the first sheet or subsequent to formation of the wheel, depending on the interrupter being used and whether the interrupter if placed on the wheel is formed contemporaneously with the wheel. One particular implementation used in order to reduce any rotating friction between the wheel 16 and one more membranes 32, 36 that are in contact with the wheel 16, would be to provide a collar. In this implementation, the wheel 16 (central portion 16a and blades 16b) is thinned on the backside (and/or front-side) to leave a narrow collar 29 of non-thinned height about the axle 18, as shown in FIG. 11E-1.

An alternative technique would be to incorporate very thin spacer layers (not shown) between the body and the membranes to in effect increase the height of the body relative to that of the wheel by a few microns to ensure free rotation of the wheel. These spacer layers would have apertures in the layers corresponding to the chambers.

Interrupters such as holes, can be provided prior to or subsequent to lamination of the second sheet to the first sheet by placing holes etc. through material that will form the wheel to change the dielectric characteristics of a portion of the wheel subsequent to formation of the wheel.

Figure 11F:
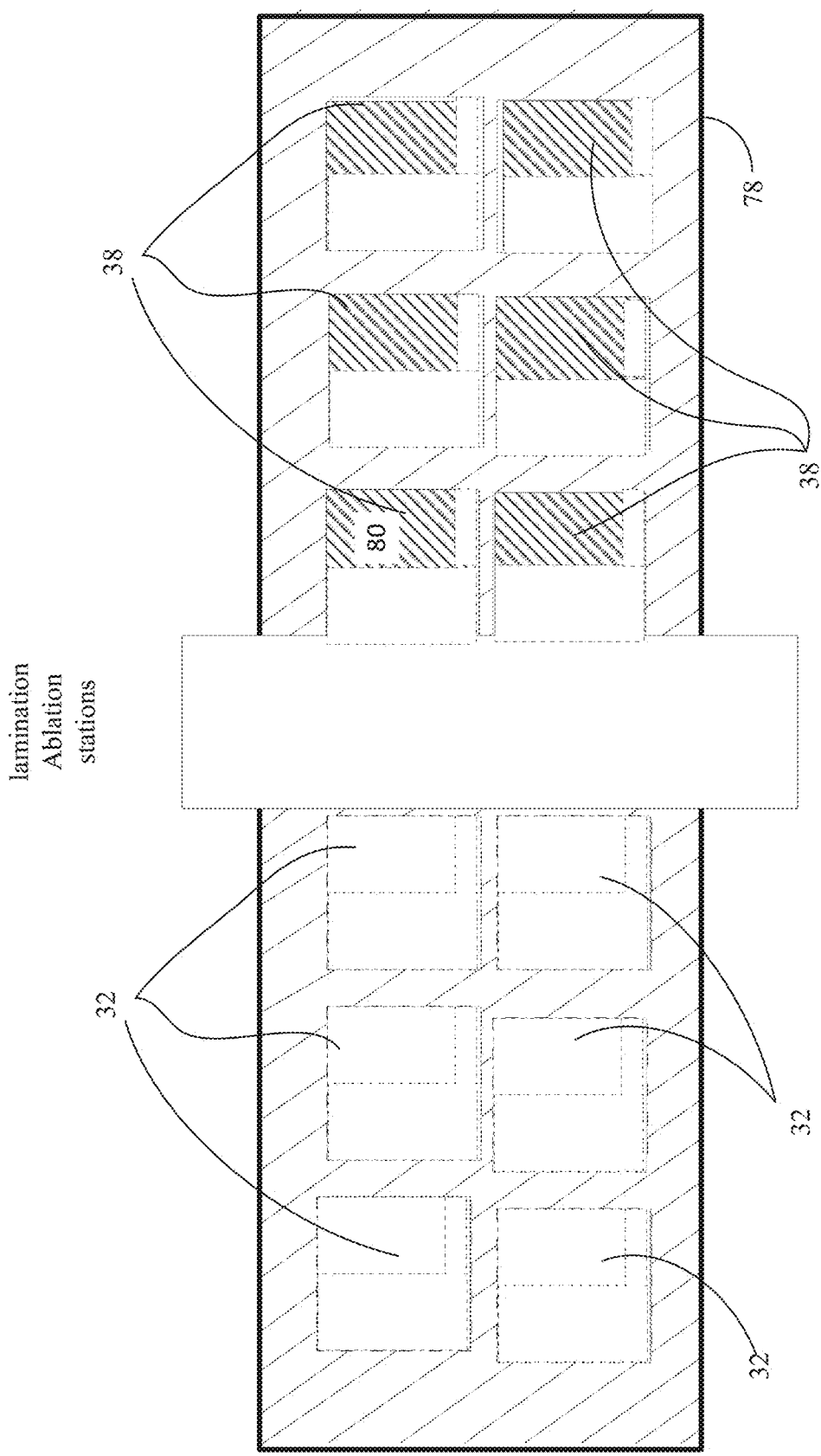

Referring now to FIG. 11F the sheet 70 from FIG. 11D can be passed through a different lamination station to apply a third sheet 78, e.g., 5 micron thick sheet of PET, with a third metallic layer 80 of Al of 100 A on a top surface of the sheet 78. This third sheet 78 is patterned and forms the membranes 36 over the flow device bodies 14 provided by the defined features of the chamber 12 and wheel 16. During alignment of the third sheet 78 the machined alignment holes (not shown) can be used in guidance for patterning the metallic layer 80 to form the electrodes 38.

Alternatively, the micro flow devices 10 of FIG. 11D after being diced to free up individual ones of the devices 10 can be arranged in a stack of two or more using the repeatable layer characteristic discussed above. A first the membrane/electrode combination of a first stacked device element 10 forms one of the electrode/membrane combination for a second stacked device element that is attached to the first device element 10.

An alternative to the roll to roll processing of FIGS. 11A-11F, a raw sheet of material is passed through plural stations to have features applied to the sheet and the sheet is subsequently taken up to produce fabricated micro flow devices, with many such fabricated micro flow devices fabricated on a sheet, as was illustrated in FIGS. 11A-11F. The processing approach discussed below can be adapted for fabrication of many micro-fabricated devices using roll to roll processing, especially where the micro-fabricated devices have features that are required to move in some fashion, e.g., rotate, slide, pivot, etc. In FIGS. 12A-12J below, the micro flow measurement device 10 (or 100) having a wheel 16 (see FIGS. 1-7) that rotates in operation will be used as an example of a micro-fabricated device that has one or more features that move, e.g., rotate, slide, pivot, etc. during device operation.

Figure 12A:
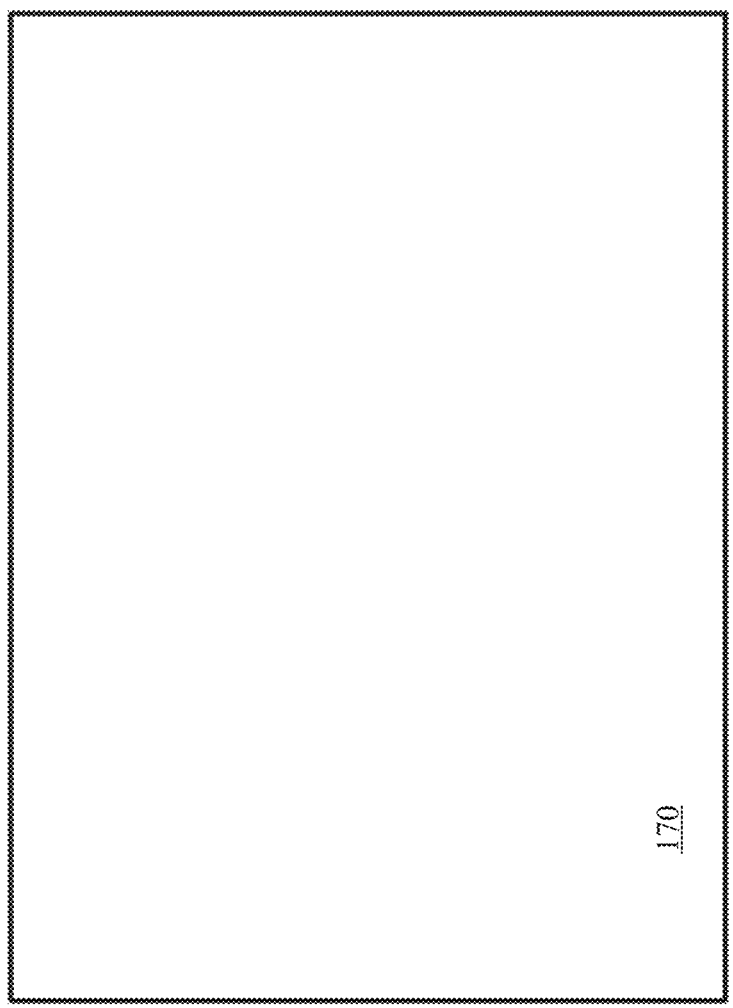
Figure 12B:
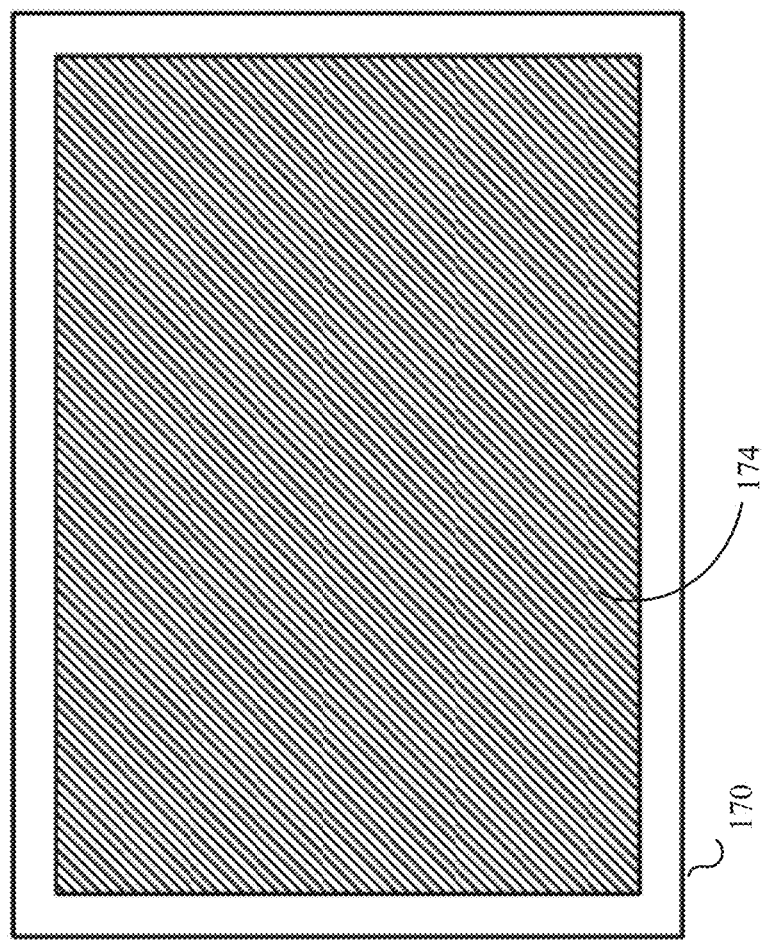

Referring now to FIGS. 12A and 12B, a sheet 170 of a flexible material such a non-metalized 50 micron thick sheet is provided with a double sided adhesive 174 over a major surface that will be used to provide the body layer 14 (FIG. 1). The adhesive is a type 1801 tape that is disposed over the sheet 170, as illustrated in FIG. 12B. For the particular implementation of the micro flow device 10, the material is polyethylene terephthalate (PET). Other materials could be used.

Referring now to FIG. 12C, the sheet 170 with the adhesive 174 is patterned to clear the adhesive from all regions that will correspond to moving parts. Thus, for the example of the wheel 16 used in the device 10, a mask (not shown) is used to configure a laser ablation station to remove the adhesive from areas of the sheet 170 within which the wheel 16 will be formed. For the flow device 10 that would involve leaving the adhesive on the central portion that will correspond to the fixed axle 18 while leaving the adhesive on frame portions of the body 14.

Figure 12D:
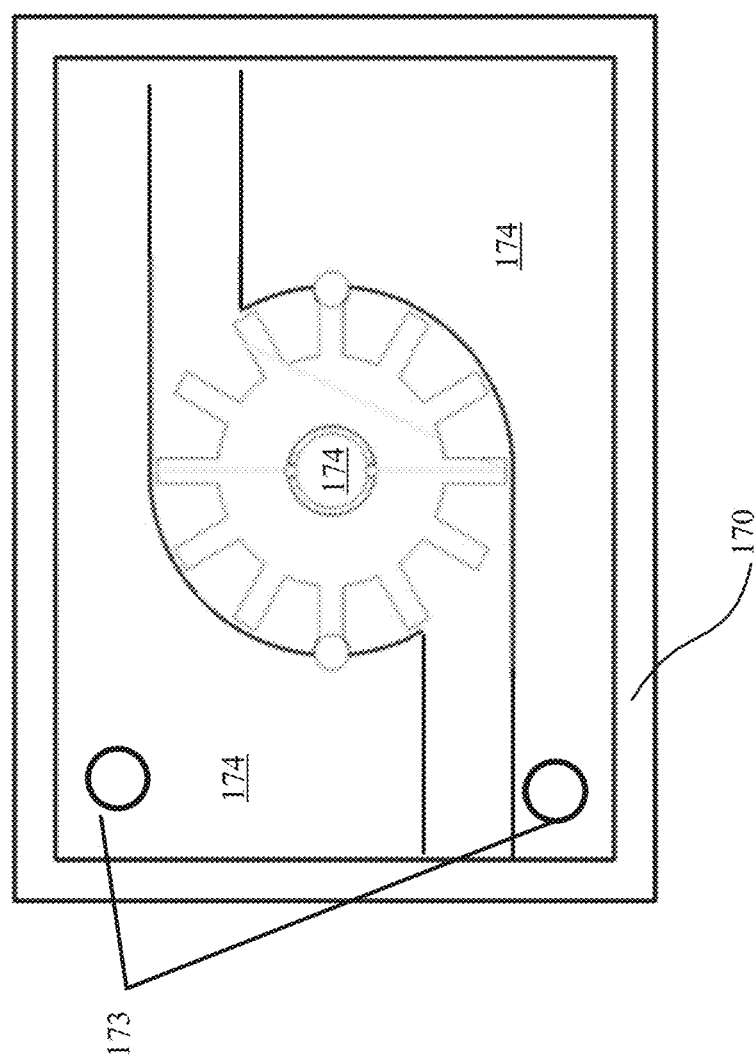

Referring now to FIG. 12D, the sheet 170 is micro-machined using another mask (not shown) or direct write to configure a laser ablation station to define or form the chamber 12 and the wheel 16 tethered as discussed in FIG. 1. Conductive vias are also provided for electrical connections. The micro-machining ablates away the material of the sheet to form the chamber 12, the wheel 16 spaced from an inter wall of the chamber 12 and the axle 18 spaced from the wheel, while leaving the frame portion of the body 14 and adhesive 174 on the frame portion of the body and the central portion of the wheel which will provide the axle.

Figure 12E:
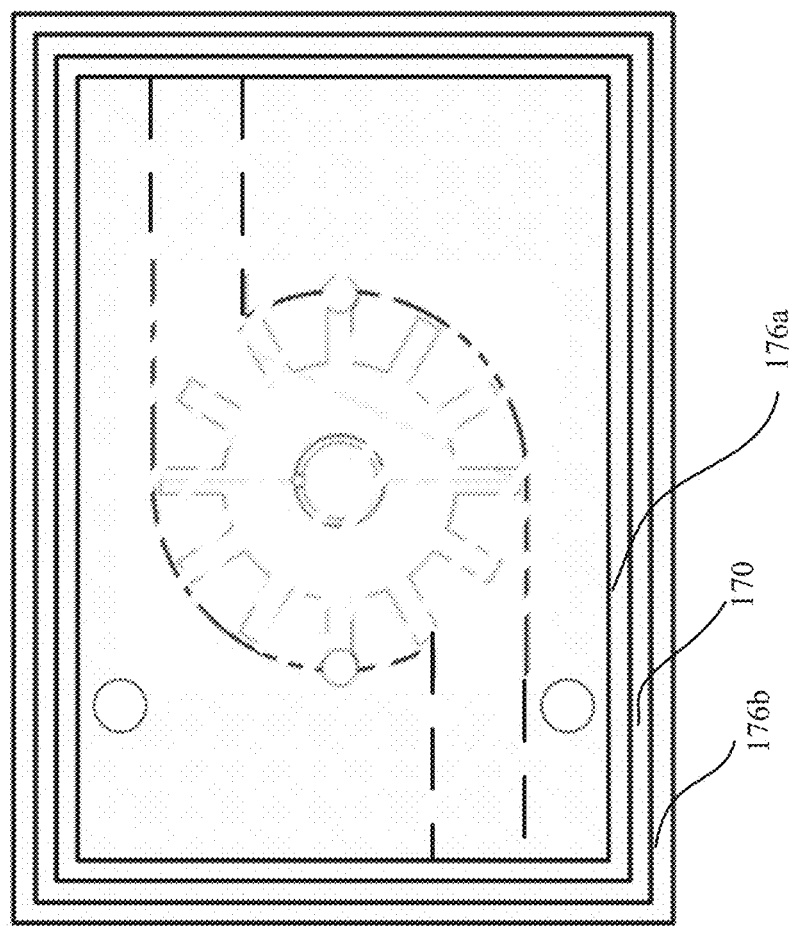

Referring now to FIG. 12E, the sheet 170 with the micro-machined chamber 12, wheel 16 and axle 18 (FIG. 1, not referenced in FIG. 12E) is affixed to membrane sheets 176a and 176b, e.g., 5 micron thick sheet of PET each with a metallic layer of Al of 100 A thickness. The sheet 170 is affixed on both sides with one of the membrane sheets 176a and 176b with the metallic layers of those sheets facing outwards from the body 14, and which provides a composite sheet 175. The regions of adhesive 174 (FIG. 12D) will adhere the sheets 176a, 176b to sheet 170.

Figure 12F:
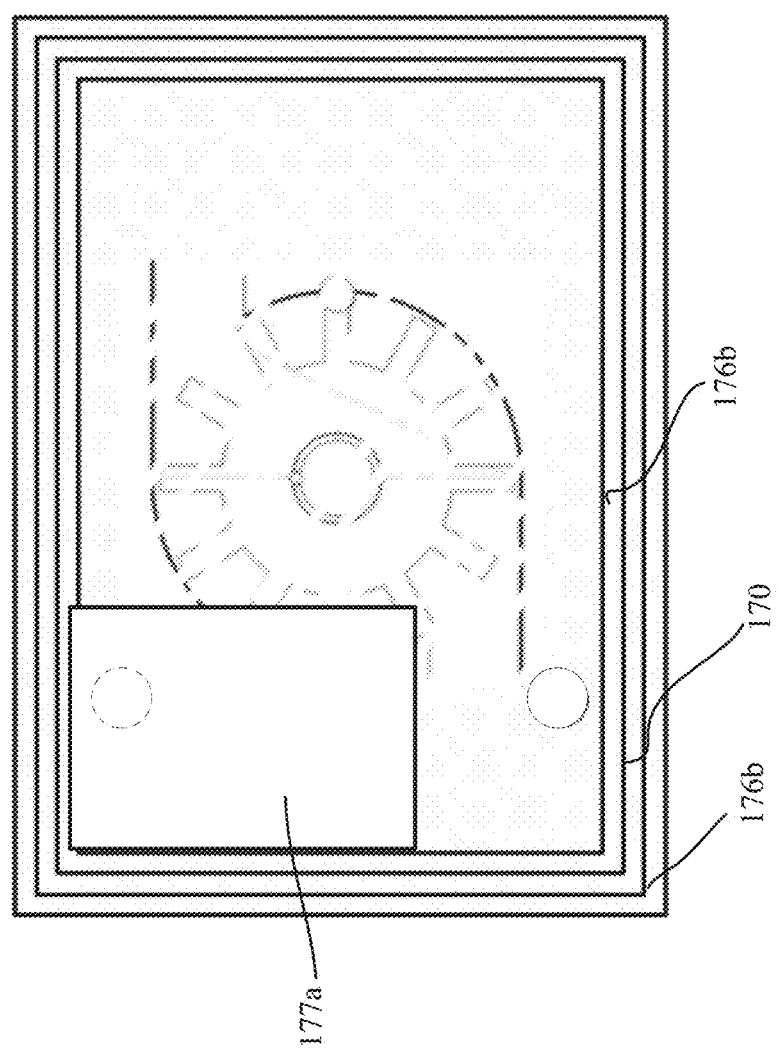
Figure 12G:
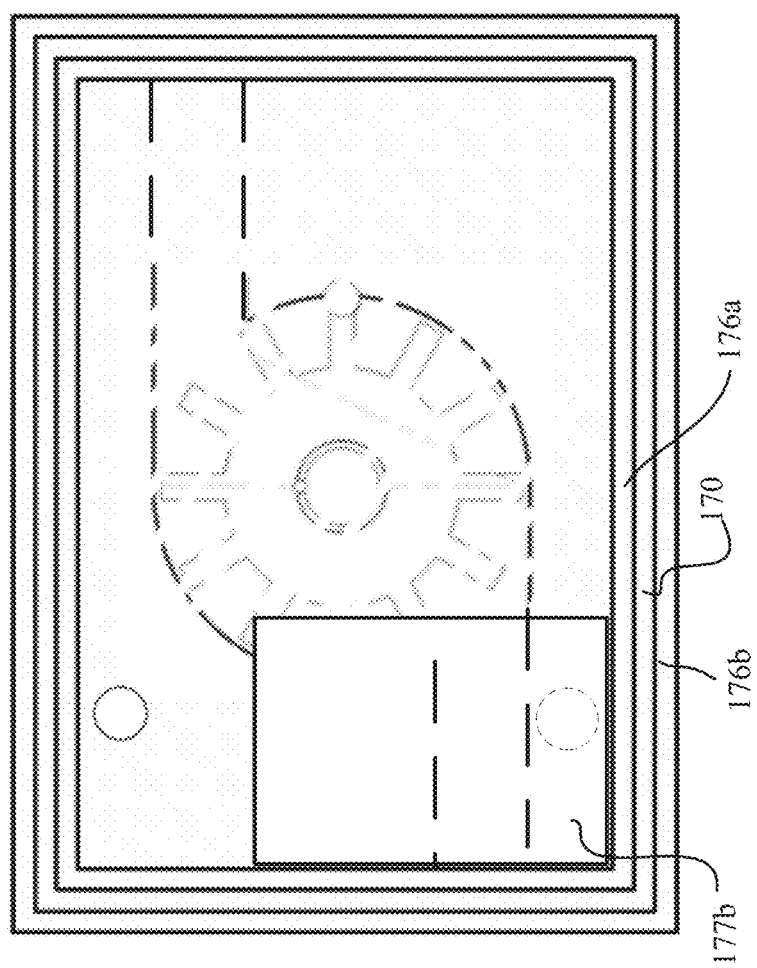

Referring now to FIGS. 12F and 12G the sheets 176a and 176b are patterned to form the patterned electrodes 177a (FIG. 12F), 177b (FIG. 12G) carried by the membrane sheets 176a, 176b. The second sheets 176a, 176b can be machined to provide alignment holes (not shown).

Figure 12H:
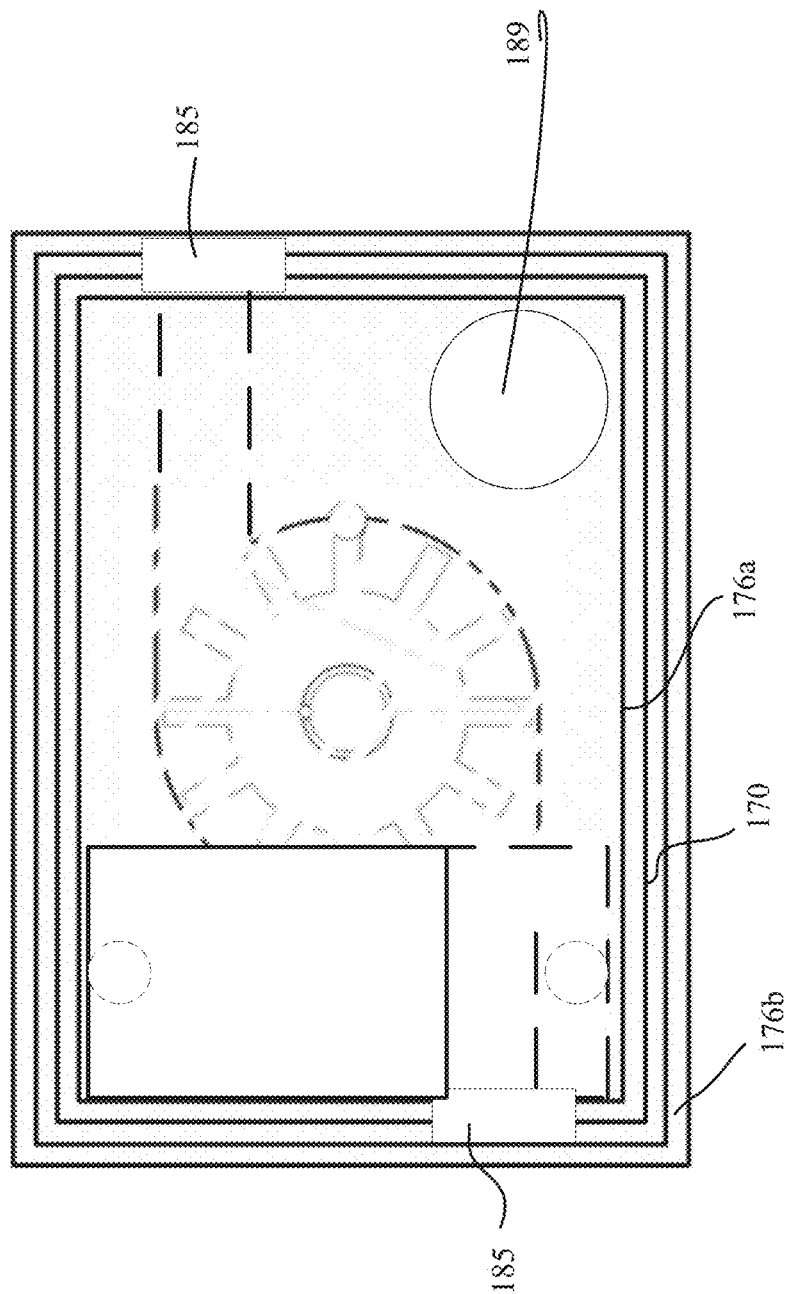

Referring now to FIG. 12H, the composite sheet 175, (sheets 176a, 170 and 176b) with the sheets 176a and 176b supporting the patterned electrodes, is patterned to cut chases 185 for fluid access ports and alignment pin holes 189, as shown.

Figure 12I:
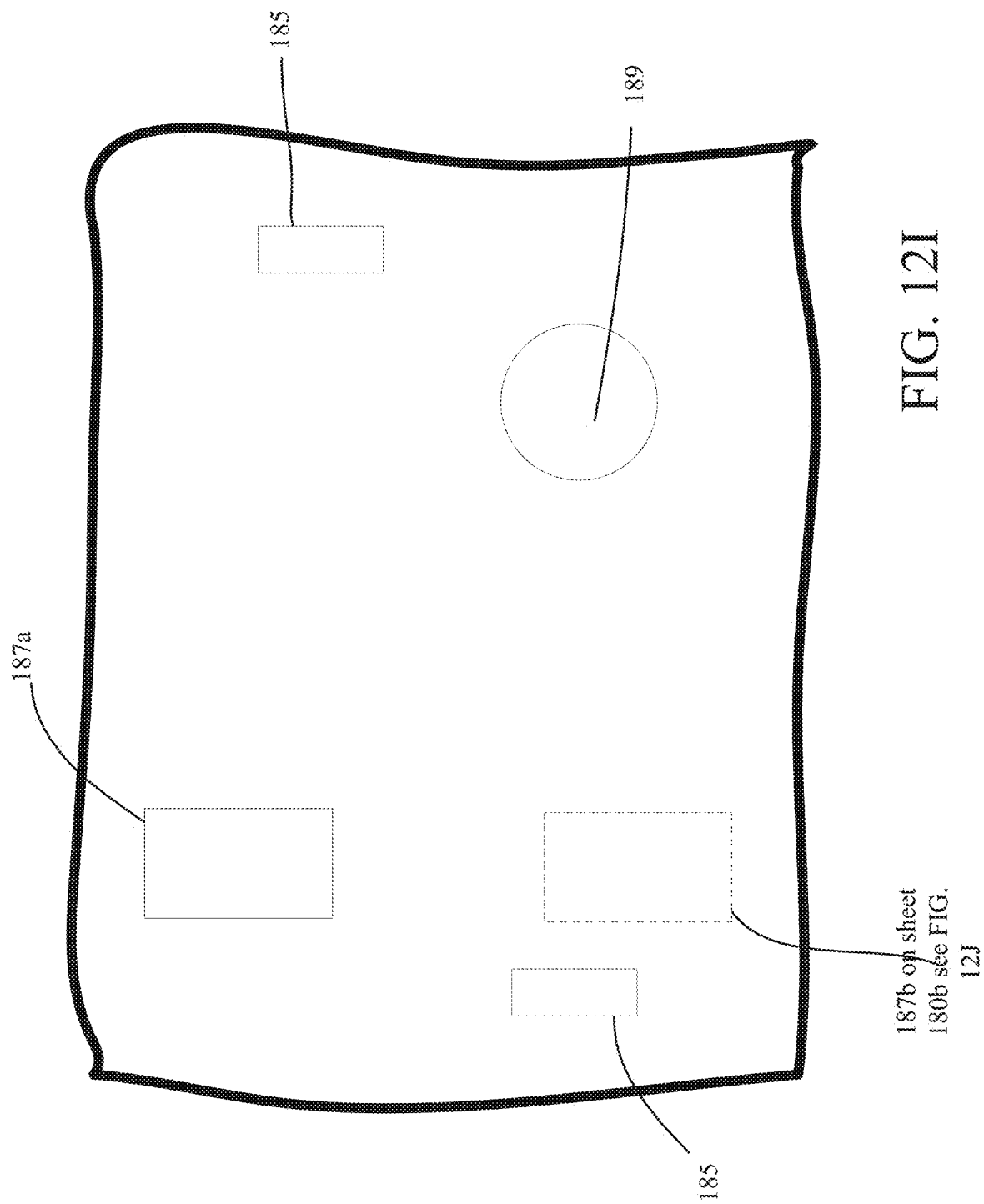
Figure 12J:
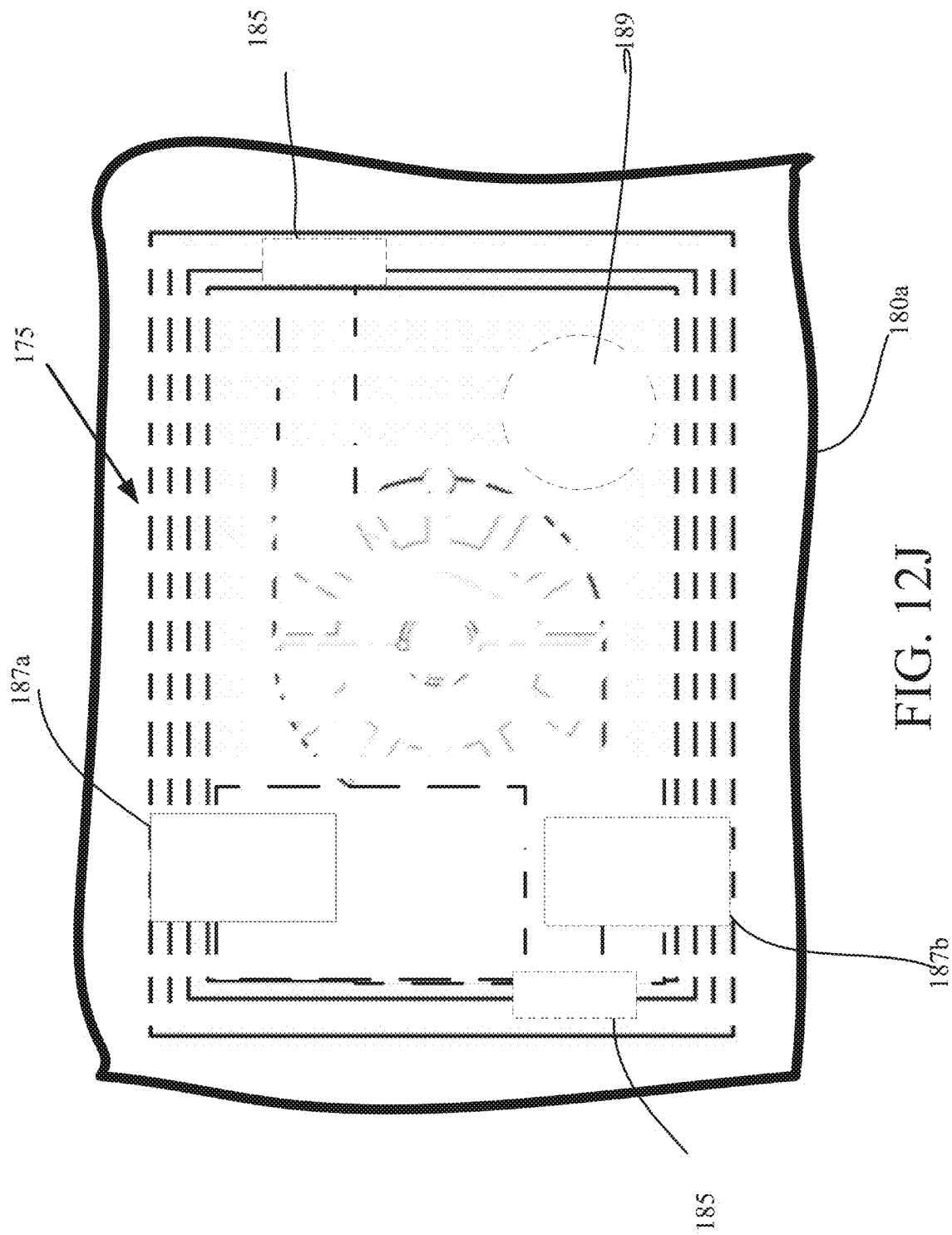

Referring now to FIG. 12I, the composite sheet 175 of FIG. 12H will be laminated between a pair of prefabricated sealing layers 180a (shown) and 180b shown in FIG. 12J. The sealing layers 180a, 180b being prefabricated 50 micron thick sheets carrying a singled sided 1801 tape. The prefabricated sealing layers 180a, 180b are processed to cut the chases 185 to access the fluid access ports, access notches 187 to access electrodes and the alignment pin holes 189 to position the flow device in a fixture and stitches (not shown) that are used to singulate (dice) plural of the devices 10 from sheet arrays (not shown).

Referring now to FIG. 12J, the composite sheet 175, with the electrode access notches 187a, 187b, released moving parts, e.g., the wheel 16, and chases 185 to access the fluid access ports, and the alignment pin holes 189 and stitches (not shown) is affixed with the pair of prefabricated sealing layers 180a, 180b disposed on either side of the composite sheet via the single sided 1801 tape.

The above technique can also use a machine vision system produce a data file that is used by the laser ablation system in aligning a laser ablation station with a mask (or direct write) such that a laser beam from the laser ablation system provides features according to the mask used in registration with the corresponding portions of the bodies, as discussed. The electrodes are formed by ablating away the metal in regions that are not part of the electrodes and conductors, leaving isolated electrodes and conductors on the sheet.

Thinning of features that form movable parts, e.g., the wheel, i.e., as discussed above could be applied with the processing of FIGS. 12A-12I including the formation of a collar.

Figure 13B:
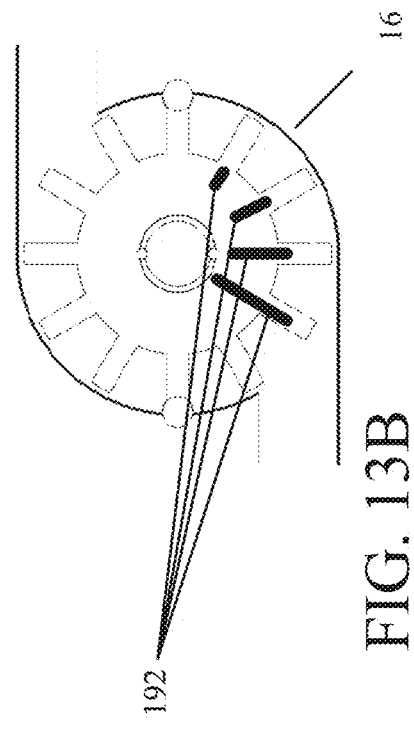
FIG. 13A-13C are views alternative interrupter features for micro flow devices.
Figure 13A:
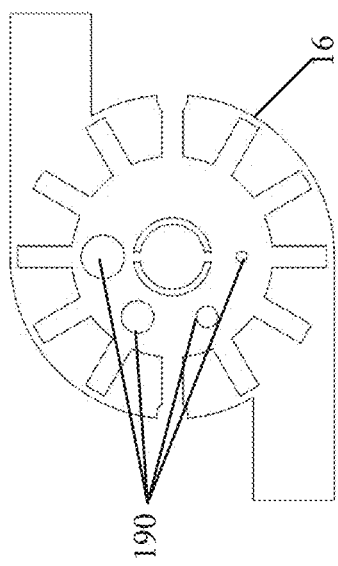
Figure 13C:
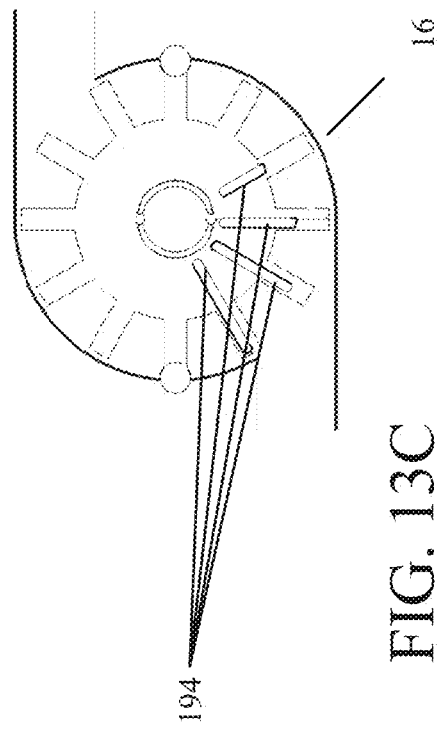

Referring now to FIGS. 13A-13C, the wheel 16 is shown with an interrupter 190 that can be either patterned metal dots or holes through the wheel 16 (FIG. 13A). This interrupter can be provided with either process discussed herein. FIG. 13B, shows the wheel 16 is shown with an interrupter 192 that is either patterned metal lines or slits (FIG. 13C) through the wheel 16. The interrupters can be provided with either process discussed herein. Whether the interrupter is a set of metal dots or a set of holes or lines or slits in the wheel 16, as the wheel 16 rotates the dielectric disposed between the overlapping portions of the conductors (not shown) will vary, which will provide a concomitant variation in capacitance between the overlapping portions and if the metal dots or holes or lines or slits are asymmetric with respect to rotation direction, rotation of the wheel will also provide from capacitance changes an indication of rotation direction, as discussed above.

A jig or test fixture (not shown) can be used in conjunction with the alignment pin holes. Other stacking techniques for assembly are possible with or without the alignment pin holes. A jig (not shown) that can comprises vertical four posts mounted to a horizontal base is used to stack individual ones of the cut dies. On the jig an end cap (e.g., a 50 micron PET sheet with a metal layer) is provided and over the end cap a first repeatable unit is provided. The repeatable unit is spot welded (applying a localized heating source) to hold the unit in place on the jig. As each repeatable unit is stacked over a previous repeatable unit that unit is spot welded. The stack is provided by having ports on one side of the stack and ports on the other of the stack, and staggered resulting from arrangement of the valves so as to have a solid surface separating each of the ports in the stack. Once a stack is completed, a top cap (not shown) can be provided. The stack unit is sent to a lamination station not shown, where the stack is laminated, laminating all of the repeatable units and caps together. The end cap and top cap can be part of the packaging as well. Otherwise sets of repeatable units can be laminated or welded in pairs. Other stacking techniques for assembly are possible with or without the alignment holes.

Via conductors to interconnect the patterned electrodes on stacked flow devices 10 are connected via the tabs with conductors that are castellated structures, i.e., with relatively wide areas contacting electrode tabs and relatively narrow areas through holes in the electrode. This arrangement is provided by having the holes in the body portions larger than the holes through the electrode portions. This can be accomplished during the patterning stages of the body and the electrodes respectively. The via conductors are formed by introduction of the conductive inks mentioned above into the holes.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

Other embodiments are within the scope of the following claims. For example, as shown in FIGS. 12A to 12J, the fabricated micro flow measurement device (FIG. 12J) includes a pair of prefabricated sealing layers 180a (FIG. 12I) and 180b shown in FIG. 12J on either side of composite sheet 175 of FIG. 12H. The sealing layers 180a, 180b in some implementations can be omitted, provided that the membrane sheets 176a and 176b are made stiff enough or strong enough to resist distorting due to air flow through the micro flow measurement device. Given that the membranes need not and should not flex or bend during operation of the micro flow measurement device (to avoid noise in measurement of capacitance, the membranes can be made thicker than 5 microns or can be made of stiffer materials such as glass or stiff plastics. In this case the basic micro flow measurement devices can be three layers, i.e., the layer housing the wheel 16 and the layers carrying the electrodes 32, 38. The electrodes face outwards and thus obviate the need for the electrode access notches 187a, 187b.

What is claimed is:

1. A micro flow device comprises:
   a body having a chamber, and a first port and a second port having passages into the chamber;
   a first membrane over a first surface of the body;
   a first electrode on a portion of the first membrane;
   a second membrane over the second opposing surface of the body;
   a second electrode on a portion of the second membrane;
   an axle in the chamber affixed to the first and second membranes;
   a wheel member disposed in the chamber and spaced from the chamber by a first gap, and spaced from the axle by a second gap; and
   an interrupter feature disposed between the first and second membranes.

2. The micro flow device of claim 1 further comprising:
   a first end cap connected to the first membrane and a second end cap connected to the second membrane, the first and second membranes of a flexible material having a thickness of several micros, the body comprised a flexible material have a thickness of a multiple of the thickness of the flexible material of the first and second membranes.

3. The micro flow device of claim 1 wherein the interrupter feature is a structural feature of the wheel member that causes a change in capacitance between the first and the second electrodes, as the wheel member rotates.

4. The micro flow device of claim 1 further comprising:
   a capacitance measurement circuit coupled to the first electrode and the second electrode.

5. The micro flow device of claim 1 wherein the interrupter feature is a symmetric feature with respect to rotation direction of the wheel.

6. The micro flow device of claim 5 wherein the interrupter feature is on the wheel and, the micro device further comprises:
   a capacitance measurement circuit coupled to the first electrode and the second electrode, with the electrode on the wheel member causing modulation of measured capacitance for rotation of the wheel member in a clockwise direction in comparison to rotation of the wheel member in a counter-clockwise direction, permitting the capacitance measurement circuit to discern flow rate but not fluid flow direction between the first and second ports.

7. The micro flow device of claim 1 wherein the interrupter feature is an asymmetric feature with respect to rotation direction of the wheel.

8. The micro flow device of claim 7 wherein the interrupter feature is on the wheel and, the micro device further comprises:
   a capacitance measurement circuit coupled to the first electrode and the second electrode, with the electrode on the wheel member causing substantially unequal modulation of measured capacitance for rotation of the wheel member in a clockwise direction in comparison to rotation of the wheel member in a counter-clockwise direction, permitting the capacitance measurement circuit to discern flow rate and fluid flow direction between the first and second ports.

9. The micro flow device of claim 1 comprising at least one additional micro flow device in a stack with the at least one micro flow device having an additional first electrode electrically connected to the first electrode and an additional second electrode electrically connected to the second electrode.

10. The micro flow device of claim 1 wherein the wheel further comprises:
    a central core; and
    a plurality of blades connected to the central core.

11. The micro flow device of claim 5 wherein the capacitance measurement circuit further comprises:
    a controller that converts measured capacitance from the capacitance measurement circuit into a flow value.

12. The micro flow device of claim 1 wherein the interrupter feature is one or more of an electrode, a set of slits a set of electrodes a set of apertures.

13. A micro flow device comprises:
    a body having a chamber, a first port, and a second port that are coupled to passages into the chamber;
    an axle member disposed about a center of the chamber;
    a wheel member disposed in the chamber about the axle member, and spaced from the axle member by a gap having a narrow gap width;
    a first membrane of a flexible material over a first surface of the body having a first electrode on a portion of the first membrane;
    a second membrane over the second opposing surface of the body having a second electrode on a portion of the second membrane; and
    an interrupter feature that causes a change in a capacitance value between the first and second electrodes, as the wheel rotates.

14. The micro flow device of claim 13 wherein the interrupter feature is a symmetric feature that cases a symmetric change in capacitance.

15. The micro flow device of claim 13 wherein the interrupter feature is an asymmetric feature that cases an asymmetric change in capacitance.

16. The micro flow device of claim 13 wherein the interrupter feature is one or more of an electrode affixed over a portion of a facial surface of the wheel member, a variation in dielectric between a first portion of the wheel and a second portion of the wheel.

* * * * *